United States Patent [19]

Sample et al.

[11] Patent Number: 5,963,735
[45] Date of Patent: *Oct. 5, 1999

[54] HARDWARE LOGIC EMULATION SYSTEM

[75] Inventors: Stephen P. Sample, Mountain View; Michael R. D'Amour, Los Altos Hills; Thomas S. Payne, Union City, all of Calif.

[73] Assignee: Quickturn Design Systems, Inc., Mountain View, Calif.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/865,559

[22] Filed: May 29, 1997

Related U.S. Application Data

[63] Continuation of application No. 08/478,964, Jun. 7, 1995, abandoned, which is a continuation of application No. 08/273,513, Jul. 11, 1994, Pat. No. 5,477,475, which is a continuation of application No. 08/171,348, Dec. 21, 1993, Pat. No. 5,329,470, which is a continuation of application No. 08/071,033, May 28, 1993, abandoned, which is a continuation of application No. 07/824,341, Jan. 23, 1992, abandoned, which is a continuation of application No. 07/279,477, Dec. 2, 1988, Pat. No. 5,109,353.

[51] Int. Cl.$^6$ .................................................... G06G 7/78
[52] U.S. Cl. ................... 395/500.45; 702/118; 714/725; 395/500; 395/500.07
[58] Field of Search ..................................... 364/488, 389, 364/490, 491, 578, 580; 395/500, 800.11, 800.29, 311, 312, 182.01, 800.22; 371/22.2, 21.2, 21.4, 28, 21.5; 340/825.83, 825.86, 825.87, 825.79, 825.84; 326/36, 37, 38, 40, 41, 44, 45, 47; 365/94, 103, 104, 154, 189.07, 189.08, 201; 702/118, 119; 714/725

[56] References Cited

U.S. PATENT DOCUMENTS 3,106,698 10/1963 Unger .
3,287,702 11/1966 Borck, Jr. et al. .

(List continued on next page.)

FOREIGN PATENT DOCUMENTS 59-161839 9/1984 Japan .
01154251 6/1989 Japan .

(List continued on next page.)

OTHER PUBLICATIONS

"The Programmable Gate Aray Data Book"; Xilinx Inc. 1988.
"The Homogenous Computational Medium; New Technology For Computation", Concurrent Logic Inc., Jan. 26, 1987.
Spandorfer, "Synthesis of Logic Functions on an Array of Integrated Circuits", Contract Report AFCRI-6-6-298, Oct. 31, 1965.
Tham, "Parallel Processing CAD Applications", IEEE Design & Test of Computer, Oct. 1987, pp. 13-17.
Agrawal, et al. "Mars: A Multiprocessor-Based Programmable Accelerator", IEEE Design & Test of Computers, Oct. 1987, pp. 28-36.
Manning, "An Approach to Highly Integratred, Computer-Maintained Cellular Array", IEEE Transactions on Computers, vol. C-26, Jun. 1977, pp. 536-552.

(List continued on next page.)

Primary Examiner—Jacques H. Louis Jacques
Attorney, Agent, or Firm—Lyon & Lyon LLP

[57] ABSTRACT

A system for physical emulation of electronic circuits or systems includes a data entry workstation where a user may input data representing the circuit or system configuration. This data is converted to a form suitable for programming an array of programmable gate elements provided with a richly interconnected architecture. Provision is made for externally connecting VLSI devices or other portions of a user's circuit or system. A network or internal probing interconnections is made available by utilization of unused circuit paths in the programmable gate arrays.

4 Claims, 16 Drawing Sheets

U.S. PATENT DOCUMENTS

| | | | |
|---|---|---|---|
| 3,287,703 | 11/1966 | Slotnick . | |
| 3,473,160 | 10/1969 | Wahlstrom . | |
| 3,928,730 | 12/1975 | Agaard et al. | 379/275 |
| 4,020,469 | 4/1977 | Manning | 326/40 |
| 4,032,899 | 6/1977 | Jenny et al. | 395/311 |
| 4,306,286 | 12/1981 | Cocke et al. | 395/500 |
| 4,315,315 | 2/1982 | Kossiakoff | 395/140 |
| 4,357,678 | 11/1982 | Davis | 395/500 |
| 4,365,294 | 12/1982 | Stokken | 395/557 |
| 4,386,403 | 5/1983 | Hsieh et al. | 364/491 |
| 4,404,635 | 9/1983 | Flaker | 364/580 |
| 4,459,694 | 7/1984 | Ueno et al. | 365/201 |
| 4,488,354 | 12/1984 | Chan et al. | 364/490 |
| 4,503,386 | 3/1985 | DasGupta et al. | 364/490 |
| 4,510,602 | 4/1985 | Engdahl et al. | 371/22.2 |
| 4,525,789 | 7/1985 | Komper et al. | 364/550 |
| 4,527,115 | 7/1985 | Mehrotra et al. | 371/22.2 |
| 4,539,564 | 9/1985 | Smithson | 340/825.79 |
| 4,541,071 | 9/1985 | Ohmori | 395/384 |
| 4,577,276 | 3/1986 | Dunlop et al. | 364/488 |
| 4,578,761 | 3/1986 | Gray | 364/481 |
| 4,593,363 | 6/1986 | Burstein et al. | 364/491 |
| 4,600,846 | 7/1986 | Burrows | 326/39 |
| 4,612,618 | 9/1986 | Pryor et al. | 364/490 |
| 4,613,940 | 9/1986 | Shenton et al. | 364/490 |
| 4,621,339 | 11/1986 | Wagner et al. | 364/489 |
| 4,642,487 | 2/1987 | Carter | 326/41 |
| 4,656,580 | 4/1987 | Hitchcock, Sr. et al. | 395/500 |
| 4,656,592 | 4/1987 | Spaanenburg et al. | 364/490 |
| 4,674,089 | 6/1987 | Poret et al. | 395/500 |
| 4,675,832 | 6/1987 | Robinson et al. | 364/488 |
| 4,695,740 | 9/1987 | Carter | 326/86 |
| 4,695,999 | 9/1987 | Lebizay | 370/217 |
| 4,697,241 | 9/1987 | Lavi | 364/488 |
| 4,700,187 | 10/1987 | Furtek | 340/825.83 |
| 4,706,216 | 11/1987 | Carter | 365/94 |
| 4,713,557 | 12/1987 | Carter | 326/86 |
| 4,722,084 | 1/1988 | Morton | 395/182.01 |
| 4,725,835 | 2/1988 | Schreiner et al. | 340/825.83 |
| 4,740,919 | 4/1988 | Elmer | 365/104 |
| 4,744,084 | 5/1988 | Beck et al. | 364/578 |
| 4,747,102 | 5/1988 | Funatsu | 395/183.09 |
| 4,752,887 | 6/1988 | Kuwahara | 364/491 |
| 4,758,745 | 7/1988 | El Gamal et al. | 326/16 |
| 4,758,985 | 7/1988 | Carter | 365/94 |
| 4,761,768 | 8/1988 | Turner et al. | 365/185.22 |
| 4,766,569 | 8/1988 | Turner et al. | 365/185.11 |
| 4,768,196 | 8/1988 | Jou et al. | 371/22.2 |
| 4,777,606 | 10/1988 | Fournier | 364/491 |
| 4,782,440 | 11/1988 | Nominzo et al. | 364/578 |
| 4,786,904 | 11/1988 | Graham et al. | 364/488 |
| 4,787,061 | 11/1988 | Nei et al. | 395/500 |
| 4,791,602 | 12/1988 | Resnick | 326/38 |
| 4,803,636 | 2/1989 | Nishiyama et al. | 395/500 |
| 4,811,214 | 3/1989 | Nosenchuck et al. | 395/800.11 |
| 4,815,003 | 3/1989 | Patatunda et al. | 364/491 |
| 4,823,276 | 4/1989 | Hiwatashi | 364/491 |
| 4,827,427 | 5/1989 | Hyduke | 364/489 |
| 4,835,705 | 5/1989 | Fujino et al. | 364/491 |
| 4,845,633 | 7/1989 | Furtek | 364/490 |
| 4,849,904 | 7/1989 | Aipperspach et al. | 364/489 |
| 4,849,928 | 7/1989 | Hauck | 395/500 |
| 4,855,669 | 8/1989 | Mahoney | 371/22.31 |
| 4,862,347 | 8/1989 | Rudy | 395/500 |
| 4,864,165 | 9/1989 | Hoberman et al. | 340/825.84 |
| 4,870,302 | 9/1989 | Freeman | 326/41 |
| 4,873,459 | 10/1989 | El Gamal et al. | 340/825.84 |
| 4,876,466 | 10/1989 | Kondou et al. | 326/38 |
| 4,882,690 | 11/1989 | Shinsha et al. | 364/490 |
| 4,901,259 | 2/1990 | Watkins | 364/578 |
| 4,901,260 | 2/1990 | Lubachevsky | 364/578 |
| 4,908,772 | 3/1990 | Chi | 364/491 |
| 4,914,612 | 4/1990 | Beece et al. | 364/578 |
| 4,918,440 | 4/1990 | Furtek | 340/825.83 |
| 4,918,594 | 4/1990 | Onizuka | 395/500 |
| 4,922,432 | 5/1990 | Kobayashi et al. | 364/490 |
| 4,924,429 | 5/1990 | Kurashita et al. | 364/578 |
| 4,931,946 | 6/1990 | Ravindra et al. | 364/490 |
| 4,935,734 | 6/1990 | Austin | 340/825.83 |
| 4,942,536 | 7/1990 | Watanabe et al. | 364/490 |
| 4,942,615 | 7/1990 | Hirose | 364/578 |
| 4,945,503 | 7/1990 | Takasaki | 364/578 |
| 4,949,275 | 8/1990 | Nonaka | 364/490 |
| 4,951,220 | 8/1990 | Ramacher et al. | 364/488 |
| 4,958,324 | 9/1990 | Devin | 365/185.22 |
| 4,965,739 | 10/1990 | Ng | 364/491 |
| 4,972,372 | 11/1990 | Ueno | 365/201 |
| 5,003,487 | 3/1991 | Drumm et al. | 364/489 |
| 5,023,775 | 6/1991 | Poret | 326/40 |
| 5,036,473 | 7/1991 | Butts et al. | 364/489 |
| 5,041,986 | 8/1991 | Tanishita | 364/489 |
| 5,046,017 | 9/1991 | Yuyama et al. | 364/491 |
| 5,051,938 | 9/1991 | Hyduke | 395/500 |
| 5,083,083 | 1/1992 | El-Ayat et al. | 371/22.2 |
| 5,093,920 | 3/1992 | Agrawal et al. | 395/800.29 |
| 5,109,353 | 4/1992 | Sample et al. | 364/580 |
| 5,253,363 | 10/1993 | Hyman | 340/825.83 |
| 5,329,470 | 7/1994 | Sample et al. | 364/578 |
| 5,352,123 | 10/1994 | Sample et al. | 439/61 |
| 5,448,496 | 9/1995 | Butts et al. | 364/489 |
| 5,452,231 | 9/1995 | Butts et al. | 364/448 |
| 5,477,475 | 12/1995 | Sample et al. | 364/578 |
| 5,644,515 | 7/1997 | Sample et al. | 364/578 |

FOREIGN PATENT DOCUMENTS

| | | |
|---|---|---|
| 1444084 | 7/1976 | United Kingdom . |
| 2182220 | 9/1986 | United Kingdom . |
| 2180382 | 3/1987 | United Kingdom . |

OTHER PUBLICATIONS

Manning, "Automatic Test, Configuration, and Repair of Cellular Arrays", Doctoral Thesis MAC TR–151 (MIT), Jun. 1975.

Shoup, "Programmable Cellular Logic Arrays," Doctoral Thesis (Carnegie–Mellon University; DARPA contract No. F44620–67–C–0058), Mar. 1970.

Shoup, "Programmable Cellular Logic," undated, pp. 27–28.

Wynn, "In–Circuit Emulation for ASIC–Based Designs" VLSI Systems Design, Oct. 1986, pp. 38–45.

Snyder, "Introduction to the Configurable, Highly Parallel Computer," Report CSD–TR–351, Office of Naval Research Contracts N00014–80–K–0816 and N00014–8–1–K–0360, Nov. 1980.

Chen, "Fault–Tolerant Wafer Scale Architectures Using Large Crossbar Switch Arrays," excerpt from Jesshope, et al., Wafer Scale Integration, A.Hilger, 1986, pp. 113–124.

Kung, "Why Systolic Architectures?," Computer, Jan. 1982, pp. 37–46.

Hedlund, "Wafer Scale Integration of Parallel Processors," Doctoral Thesis (Purdue University; Office of Navel Research Contracts N00014–80–K–0816 and N00014–81–K–0360) 1982).

Hedlund et al., "Systolic Architectures—A Wafer Scale Approach," IEEE, 1984, pp. 604–610.

Choi et al., "Fault Diagnosis of Switches in Wafer–Scale Arrays," AIEEE, 1986, pp. 292–295.

Beece et al., "The IBM Engineering Verification Engine," 25th ACM/IEEE Design Automation Conference, Paper 17.1, 1988, pp. 218–224.

Pfister, "The Yorktown Simulation Engine: Introduction," 19th Design Automation conference, Paper 7.1 1982, pp. 51–54.

Denneau, "The Yorktown Simulation Engine," 19th Design Automation conference, Paper 7.2, 1982, pp. 55–59.

Kronstadt, et al., "Software Support for the Yorktown Simulation Engine," 19th Design Automation conference, Paper 7.3, 1982, pp. 60–64.

Koike, et al., "HAL: A High–Speed Logic Simulation Machine," IEEE Design & Test, Oct. 1985, pp. 61–73.

Shear, "Tools help you retain the advantages of using breadboards in gate–array design," EDN, Mar. 18, 1987, pp. 81–88.

McClure, "PLD Broadboarding of Gate Array Designs," VLSI Systems Design, Feb. 1987, pp. 36–41.

Anderson, "Restructurable VLSI Program" Report No. ESD–TR–80–192 (DARPA Contract No. F19628–80–C–0002), Mar. 31, 1980.

Xilinx, First Edition, "The Programmable Gate Array Design Handbook," 1986, pp. 1–1 to 4–33.

Odawara, "Partitioning and Placement Technique for CMOS Gate Arrays," IEEE Transactions on Computer Aided Design, May 1987, pp. 355–363.

Beresford, "Hard Facts, Soft ASICS," VLSI Systems Design, Dec. 1986, p. 8.

Beresford, "An Emulator for CMOS ASICS," VLSI Systems Design, May 4, 1987, p. 8.

Wynn, "Designing with Logic Cell Arrays," Electro/87 and Mini/Micro Northeast Conference Record, 1987.

Malik, Sharad, et al., "Combining Multi–Level Decomposition and Topological Partitioning for PLAS," IEEE 1987, pp. 112–115.

Bradsma, et al. "The Hardware Simulator: A Tool for Evaluating Computer Systems," IEEE Transactions on Computers, Jan., 1977, pp. 68–72.

Horstmann, "Macro Test Circuit Generation," IBM TDM vol. 18, No. 12, May 1976 pp. 4023–4029.

IBM TDM, "Testing Multiple Discrete Software Components by Connecting Real and Simulated Hardware Components," vol. 30, No. 4, Sep., 1987, pp. 1844–1845.

Mentor Graphics Corp., "Gate Station User's Manual," 1987, (excerpts).

Mentor Graphics Corp., "Technology Definition Format Reference Manual," 1987, (excerpts).

Minnick, "Survey of Microcellular Research," Stanford Research Institute Project 5876 (Contract AF 19(628)–5828), Jul. 1966).

Minnick, "A Programmable Cellular Array," undated, pp. 25–26.

Minnick, "Cutpoint Cellular Logic," IEEE Transactions on Electronic Computers, Dec. 1964, pp. 685–698.

Jump, et al. "Microprogrammed Arrays," IEEE Transactions on Computers, vol. C–21, No. 9, Sep. 1972, pp. 974–984.

Gentile, et al. "Design of Switches for Self–Reconfiguring VLSI Array Structures," Microprocessing and Microprogramming, North–Holland, 1984, pp. 99–108.

Sami, et al. "Reconfigurable Architectures for VLSI Processing Arrays," AFIPS Conference Proceedings, 1983 National Computer Conference, May 16–19, 1983, pp. 565–577.

Kautz, et al., "Cellular Interconnection Arrays," IEEE Transactions on Computers, vol. C–17, No. 5, May 1968, pp. 443–451.

Kautz, et al., "Cellular Logic–in–Memory Arrays," IEEE Transactions on Computers, vol. C–18, No. 8, Aug. 1969, pp. 719–727.

Goossens, et al., "A Computer–Aided Design Methodology for Mapping DSP–Algorithms Onto Custom Multi–Processor Architectures," IEEE 1986, pp. 924–925.

Runner, "Synthesizing Ada's Ideal Machine Mate," VLSI Systems Design, Oct., 1988, pp. 30–39.

Wagner, "The Boolean Vector Machine," ACM Sigarch, 1983, pp. 59–66.

Preparata, "The Cube–Connected Cycles: A Versatile Network for Parallel Computation," Communications of the ACM, May, 1981, pp. 300–309.

Clos, "A Study of Non–Blocking Switching Networks," The Bell System Technical Journal, Mar. 1953, pp. 406–424.

Masson, "A Sampler of Circuit Switching Networks" Computer, Jun. 1979, pp. 32–48.

"Plus Logic FPGA2020 Field Programmable Gate Array" Brochure by Plus Logic, San Jose, CA, pp. 1–13.

Wirbel, "Plus Logic Rethinks PLD Approach," newspaper article, not dated, one page.

Schmitz, "Emulation of VLSI Devices using LCAs" VLSI Systems Design, May 20, 1987, pp. 54–62.

Abramovici, et al., "A Logic Simulation Machine," 19th Design Automation Conference, Paper 7.4, 1982, pp. 65–73.

Hennessey, "Partitioning Programmable Logic Arrays," undated, pp. 180–181.

DeMicheli, et al., "Topological Partitioning of Programmable Logic Arrays," undated, pp. 182–183.

Munoz, et al., "Automatic Partitioning of Programmable Logic Devices," VLSI Systems Design, Oct. 1987, pp. 74–86.

Feng, "A Survey of Interconnection Networks," Computer, Dec. 1981, pp. 12–27.

Chapter 36, "Switching Networks and Traffic Concepts," Reference Data for Radio Engineers, Howard W. Sams & Co., 1981, pp. 36–1 to 36–16.

Donnell, "Crosspoint Switch: A PLD Approach," Digital Design, Jul. 1986, pp. 40–44.

"ERA60100 Electrically Reconfigurable Array–ERA," Brochure by Plessey Semiconductors, Apr. 1989.

Fiduccia, et al. "A Linear–Time Heuristic For Improving Network Partitions," IEEE Design Automation Conference, 1982, pp. 175–181.

Trickey, "Flamel: A High–Level Hardware Compiler," IEEE Transactions on Computer–Aided Design, Mar., 1987, pp. 259–269.

Schweikert, "A Proper Model for the Partitioning of Electrical Circuits," Bell Telephone Laboratories, Inc. Murray Hill, N.J., pp. 57–62.

"Partitioning of PLA Logic," IBM TDM, vol. 28, No. 6, Nov. 1985, pp. 2332–2333.

Hou, et al., "A High Level Synthesis Tool for Systolic Designs," IEEE, 1988, pp. 665–673.

"Gate Station Reference Manual," Mentor Graphics Corp., 1987 (excerpts).

Dussault, et al., "A High Level Synthesis Tool for MOS Chip Design," 21st Design Automation conference, 1984, IEEE, pp. 308–314.

DeMicheli, et al., "Hercules—A System for High Level Synthesis," 25th ACM/IEEE Design Automation Conference, 1988, pp. 483–488.

McCarthy, "Partitioning Adapts Large State Machines to PLDs," EDN, Sep. 17, 1987, pp. 163–166.

HARDWARE LOGIC EMULATION SYSTEM

This is a continuation of prior pending application Ser. No. 08/478,964, filed on Jun. 7, 1995 now abandoned, which is a continuation of application Ser. No. 08/273,513, filed Jul. 11, 1994, now U.S. Pat. No. 5,477,475, which is a continuation of application Ser. No. 08/171,348 filed on Dec. 21, 1993, now U.S. Pat. No. 5,329,470, which is a continuation of application Ser. No. 08/071,033, filed May 28, 1993, now abandoned, which is a continuation of application Ser. No. 07/824,341 filed Jan. 23, 1992, now abandoned, which is a continuation application of Ser. No. 07/279,477, filed Dec. 2, 1988, now U.S. Pat. No. 5,109,353.

BACKGROUND OF THE INVENTION

1. Field of the Invention the present invention relates to electronic hardware systems. More particularly, the present invention relates to apparatus for emulation of electronic hardware systems.

2. The Prior Art

As electronic components and electronic systems have become more complex, the design of these components and systems has become a more time consuming and demanding task. Recently software simulation of electronic components and systems has become an important tool for designers. Simulation of a design is the execution of an algorithm that models the behavior of the actual design. Simulation provides the ability to analyze and verify a design without actually constructing the design and has many benefits in the design process. However, simulation suffers from three major limitations: the speed of the simulation, the need for simulation models, and the inability to actually connect a simulation of one part of a design to an actual physical implementation of another part of the design.

Simulation accelerators have come to be used to address the problems of the execution speed of simulation. A simulation accelrator uses special purpose hardware to execute simulation algorithms in order to achieve higher speeds than can be achieved using general purpose computers. None the less, simulation accelerators still execute an algorithm that models the actual design and consequently remain substantially slower than a real hardware implementation. Accelerators do not in any way obviate the need for software models of all devices to be simulated.

Physical modeling systems such as the Valid Real Chip or Daisy PMX address the problem of the lack of availability of software models for complex standard parts. They also address to some degree the speed of execution of complex software models. Physical modelers are used in conjunction with software simulators. The modeling engine and an actual part plugged into it are used in lieu of a model of that part and are connected to a simulator which can then use the actual responses of the part in lieu of a simulation model of the part. The primary innovations in the arena of physical modeling have been associated with this connection between the modeler and the simulator.

Similar design and verification problems that arise with the use of standard microprocessors have been addressed through the use of microprocessor in-circuit emulators supplied by a number of companies. A microprocessor in-circuit emulator uses an actual microprocessor, or a specially modified version of the standard microprocessor, combined with special purpose instrumentation logic to make the job of debugging a design easier. A microprocessor in-circuit emulator includes a cable which can be plugged into a system in lieu of the actual microprocessor so that the actual system can be run at or near real time during debugging.

While all of these techniques provide advantages in the design and verification process, none satisfy all of the needs for designing and debugging including: near real time operation for non-standard parts, in-circuit emulation for other than standard parts, and freedom from the need for software models for all devices.

BRIEF DESCRIPTION OF THE INVENTION

An apparatus is disclosed and claimed which aids in the development of integrated circuit and system design by quickly and automatically generating a hardware prototype of the integrated circuit or system to be designed from the user's schematics or net list. The prototype is electrically reconfigurable and may be modified to represent an indefinite number of designs with little or no manual wiring changes or device replacement. The prototype runs at real time or close go real time speed and may be plugged directly into a larger system. VLSI chips or ASIC devices may be plugged into the prototype and run as part as the emulated design.

The apparatus of the present invention includes an emulation array, which is an array of an electrically programmable gate arrays used to implement the necessary logic functions and connect them together into a complete design. The gate arrays provide both logic implementation and signal routing between fixed printed circuit board traces. Few or no manual steps such as wire wrapping, or replacement of PALs are required to modify the design.

External cables along with a series of adaptor plugs allow the programmable breadboard to be connected directly to an existing system or printed circuit board. The apparatus of the present invention replaces a chip or board as a part of a larger system. Additional debugger hardware is included to allow internal nodes of the design to be probed and the resulting wave forms displayed without requiring the user to manually move wires. Internal nodes may also be stimulated.

A user supplied netlist or schematic is converted into a correct configuration file for use by the apparatus.

BRIEF DESCRIPTION OF THE DRAWINGS

FIG. 8 is a block diagram of the contents of configuration unit 14 of FIG. 1a.

DETAILED DESCRIPTION OF A PREFERRED EMBODIMENT

Figure 1A:
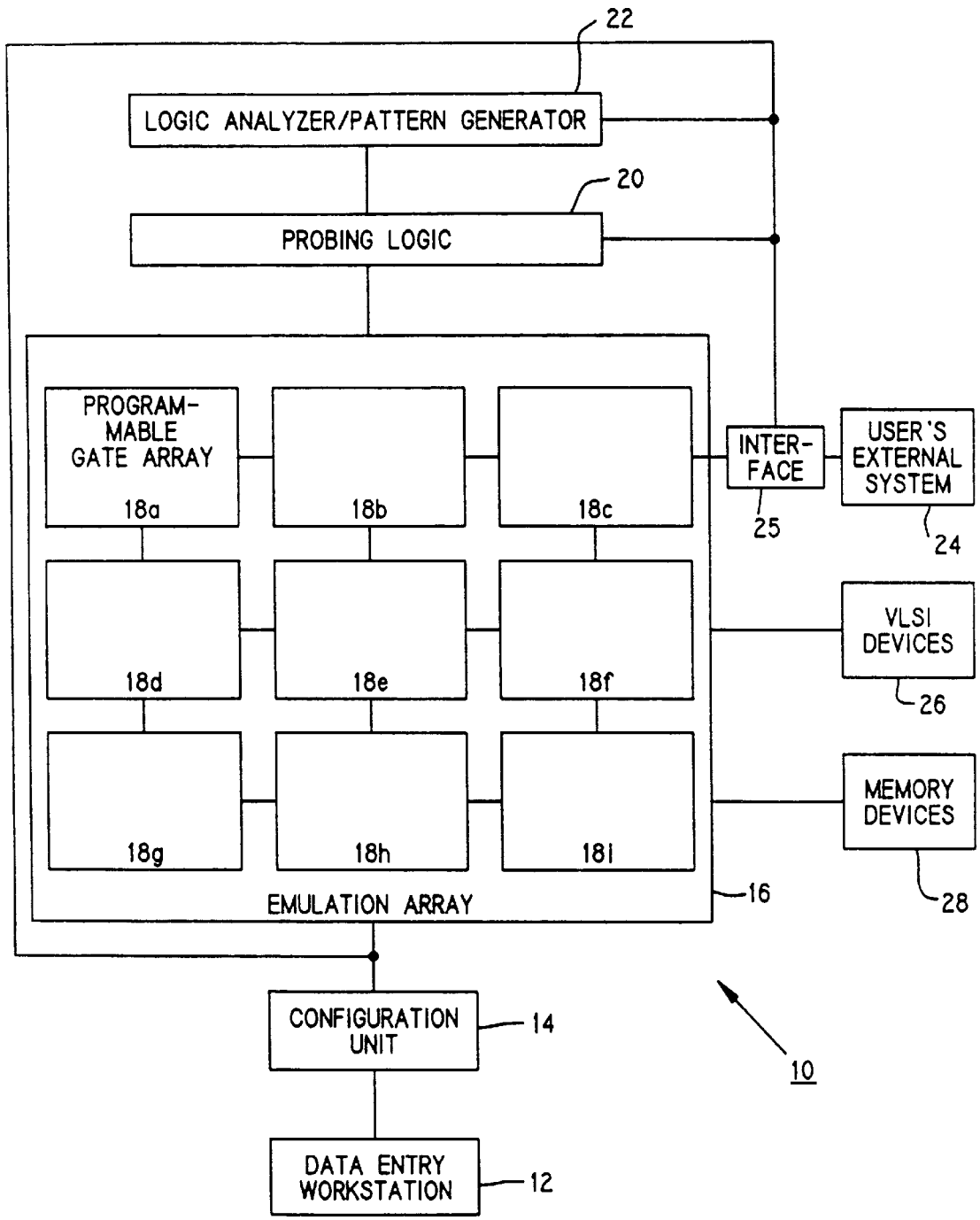
FIG. 1a is a block diagram of a presently-preferred embodiment of apparatus of the present invention.

A preferred embodiment of the apparatus of the present invention is depicted in FIG. 1a. Emulation apparatus 10 includes a data entry workstation 12, at which a user enters information describing the electronic circuit or system which it is desired to emulate. Configuration information created by the data entry work station 12 is passed to configuration unit 14. Configuration unit 14 contains the circuitry necessary to accomplish the programming of the programmable gate arrays which are contained within emulation array 16.

The heart of the system of the present invention is emulation array 16. Emulation array 16 includes a plurality of programmable gate array devices 18. The programmable gate array devices 18 are arranged in a matrix. For illustrative purposes only, emulation array 16 of FIG. 1 is shown as a 3×3 matrix containing 9 total gate arrays, denoted by reference numerals 18a–18i. Those of ordinary skill in the art will readily recognize that the 3×3 array depicted in FIG. 1 is for illustration only and that, in an actual embodiment, the size of emulation array 16 is limited only by simple design choice.

In an actual implementation, emulation array 16 may be a three dimensional array and, in a presently preferred embodiment, consists of a plurality of circuit boards each containing a matrix of individual programmable gate array integrated circuit devices 18. In a presently preferred embodiment, each card contains a 6×6 matrix of programmable gate arrays 18. In the presently-preferred embodiment, an additional row of 6 programmable gate arrays exists on each card for use in test probing.

In a presently preferred embodiment, programmable gate array integrated circuit devices 18 may be XC3090 integrated circuits manufactured by Xilinx Corporation of San Jose, Calif. These integrated circuits and their use are described in the publication *Programmable Gate Array Data Book*, Publication No. PN0010048 01 which is expressly incorporated herein by reference.

Figure 1B:
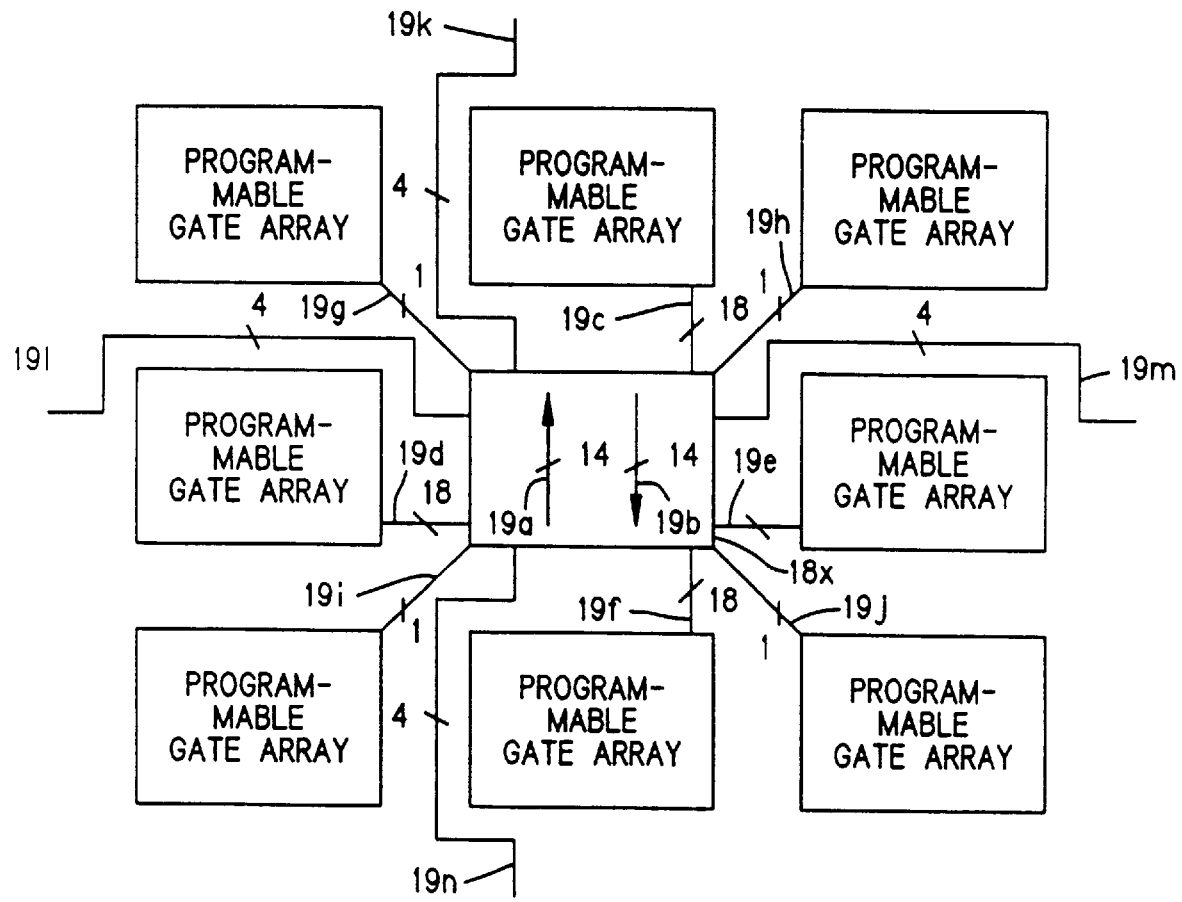
FIG. 1b is a block diagram of a programmable gate array used in the presently preferred embodiment, shown surrounded by eight of its immediate neighbors in the array matrix, illustrating I/O pin interconnections.

The I/O pin wiring in between programmable gate array chips 18 in the present invention is illustrated with respect to FIG. 1b. FIG 1b shows six programmable gate arrays in a matrix. The programmable gate array in the center, reference numeral 18x, is shown having connections to its neighbors.

Each one of the programmable gate arrays 18 has a fixed number of its input/output (I/O) pins wired to a backplane. These I/O pins are used for intercard wiring, and inclusion of VLSI integrated circuits to be included in the emulated circuit. In a presently preferred embodiment, twenty-eight I/O pins on each gate array 18x are wired to a back plane and are used for inclusion of VLSI devices in the emulated circuit. These same I/O pins may be connected, fourteen each, to corresponding programmable gate arrays (i.e., those in corresponding positions) on the circuit boards immediately above and below the board containing programmable gate array 18x. These are denoted by the up and down arrows indicating fourteen lines, reference numerals 19a and 19b. Ten I/O pins on each gate array 18 are dedicated to the input/output lines of the emulated system, (not shown in FIG. 1b) and nine I/O pins are used for probing internal nodes (not shown in FIG. 1b).

The remaining ninety-six I/O pins on each gate array 18 are used to interconnect to input/output pins on other programmable gate arrays in the matrix. In a presently-preferred embodiment, eighteen I/O pins (reference numerals 19c–f) are connected to each adjacent programmable gate array. Four I/O pins are connected to a global four bit bus connecting all gate arrays, four I/O pins are connected one each to the gate arrays in the corners of the matrix (reference numerals 19g–j) and four I/O pins in each horizontal and vertical direction (reference numerals 19k–n) leapfrog; i.e., are connected to the chip once removed.

To increase the richness of the interconnect possibilities of the emulation array of the present invention, the interchip connections are "wrapped around" the ends of the matrix. This means that, for instance, I/O pins of the programmable gate array chip 18a in FIG. 1a are connected to the I/O pins on the programmable gate array chip 18c, I/O pins on the programmable gate array 18d are connected to I/O pins on the programmable gate array chip 18f, and I/O pins on the programmable gate array chip 18g are connected to I/O pins on the programmable gate array chip 18i.

Likewise, I/O pins on the programmable gate array chip 18a, are connected to I/O pins on the programmable gate array chip 18g, I/O pins on the programmable gate array chip 18b are connected to I/O pins on the programmable gate array chip 18h, and I/O pins on the programmable gate array chip 18c are connected to I/O pins on the programmable gate array chip 18i.

In a preferred embodiment of the system of the present invention, the emulation array 16 is a three dimensional array, and is composed of a plurality of cards each containing a 6×6 matrix. The intercard technique is extended in the vertical third dimension such that I/O pins on the programmable gate arrays on one level of the matrix on a given card have connections to I/O pins on the corresponding programmable gate arrays on the cards immediately above and below. In addition, connections from the arrays on the top card are wrapped around to corresponding arrays on the bottom card. In this manner, the richest possibility of interconnects and routing choices is presented.

Data entry work station 12 may be a presently-available work station such as those manufactured by Daisy, Mentor, and Valid Logic. Data entry workstation 12 generates a gate level net list from data input by the user in the manner well known in the art. Using several software programs, the operation of which is disclosed infra, data entry workstation 12 produces a set of files necessary to program the interconnections and logic functions within each of the programmable gate array chips in emulation array 16, probing logic section 20, logic analyzer/pattern generator 22 and interface 25. Configuration unit 14 then configures the system using the files producer by data entry workstation 12.

Figure 1C:
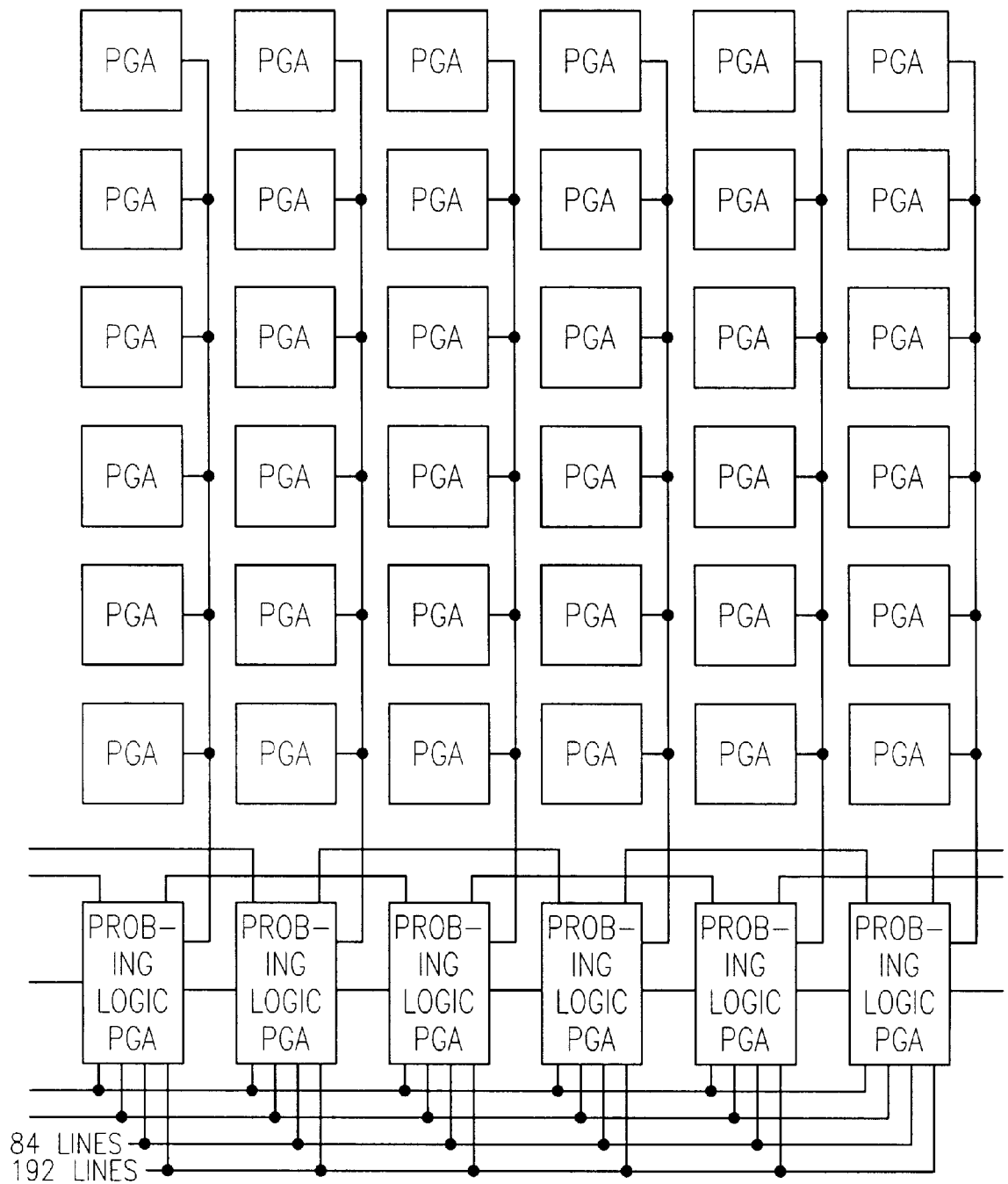
FIG. 1c is a block diagram showing the interconnections between programmable gate arrays and probe programmable gate arrays in a presently-preferred embodiment of the present invention.

Probing logic section unit 20 includes a plurality of probing logic programmable gate arrays which, in a preferred embodiment, per circuit board, are equal in number to one of the dimensions of the matrix per card. As illustrated in FIG. 1c, six probing logic programmable gate arrays are utilized in the presently preferred embodiment where the matrix is a 6×6 matrix. These gate arrays have I/O pin interconnections to each of the programmable gate arrays in the matrix column located adjacent to these arrays. For example, the first probing logic array has a number of interconnections to programmable gate arrays 18a, 18d, and 18g of FIG. 1a.

In the presently preferred embodiment, fifty-four I/O connections on each of the probing logic programmable gate arrays are provided to the six programmable gate arrays in the column of the matrix above it, nine of those connections per programmable gate array. In addition, each probing logic programmable gate array has connections to others. In this manner, a probing logic programmable gate array may be connected to any of the other programmable gate arrays in the entire matrix.

Probing logic unit 20 provides a means of connecting the logic analyzer/pattern generator 22 to the desired nodes in the design contained in the emulation array 16. Configuration unit 14 makes the connections between probing logic 20 and logic analyzer/pattern generator 22. The pattern generator provides signals to the design configured in and running in emulation array 16 and the logic analyzer monitors circuit activity in the design.

The emulation array 16 connects to the user's external system 24, such that the portion of the external system which is being emulated by the emulation array 16 may actually be connected into the user's external system 24. One or more VLSI devices, shown at reference number 26, may also be incorporated into the design being emulated by system 10. In addition to VLSI devices, other circuit functions utilizing discrete components and/or integrated circuits, may be placed in reference numbers 26. Provision is made for incorporates these devices by providing a number of I/O pin connections from the programmable gate arrays 18 out to a circuit card upon which the one or more VLSI devices, such as microprocessors and the like may be located. Outboard devices placed at reference number 26 may be placed there because they cannot, for one or more reasons, be effectively implemented in the array. High speed or analog circuits are two such examples.

Additionally, memory devices shown at reference numeral 28 in FIG. 1 may be connected into the emulation array. The preferred configurations of the VSLI devices 26 and the memory devices 28 will be explained with respect to FIGS. 3 and 4 respectively.

Figure 2:
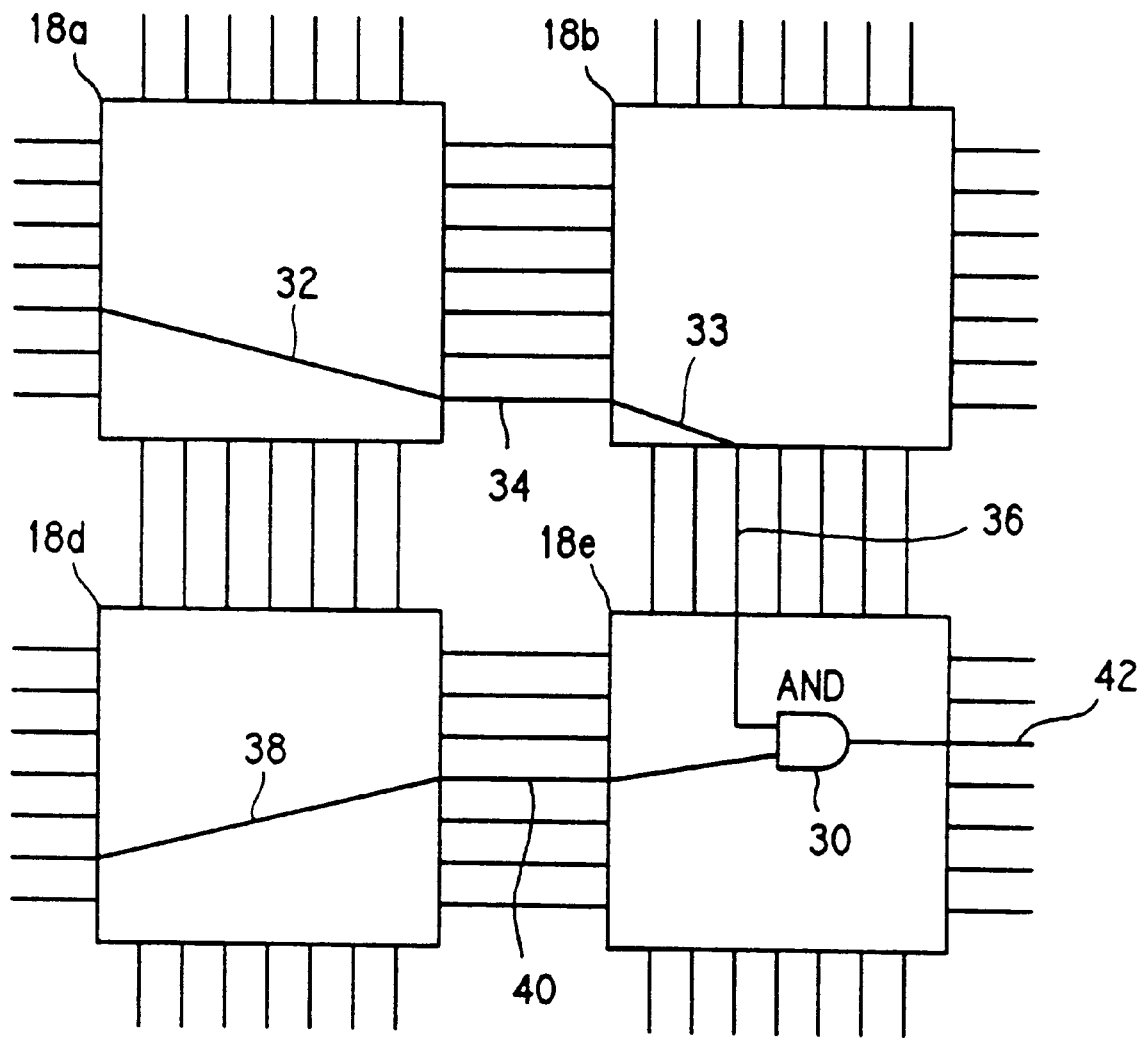
FIG. 2 is a block diagram of a portion of the emulation array matrix of a presently-preferred embodiment showing four programmable gate arrays and showing how an exemplary circuit may be connected using those programmable gate array chips.

Referring now to FIG. 2, a portion of the emulation array 16 of the system 10 of the present invention is shown to include programmable gate array devices 18a, 18b, 18d, and 18e, interconnected as they would be in the matrix. In the example shown in FIG. 2, an AND-gate 30 is shown in programmable gate array 18e, having its first input connected through conductor 32 in programmable gate array 18a, conductor 34 in between gate arrays 18a and 18b conductor 33 in gate array 18b, and conductor 36 in between gate arrays 18b and 18e. A second input to AND-gate 30 is connected via conductor 38 in programmable gate array 18d and conductor 40 between programmable gate array 18d and 18e. The output of AND-gate 30 is connected to conductor 42 out of programmable gate array 18e. The connections in between programmnable gate array chips, i.e., 34, 36 and 40, are hard wired, preferably by means of printed circuit board traces, while internal connections in programmable gate array chips, i.e., 32,33 and 38, are made by means of the configuration information loaded into them by configuration unit 14.

Those of ordinary skill in the art will readily recognize that the example shown in FIG. 2 is a simplified example for illustrative purposes only and that in an actual circuit emulation, programmable gate arrays 18a, 18b, 18d, and 18e shown in FIG. 2 will contain more logic functions and will be much more richly connected. In fact, once configured, the emulation array will contain the entire circuit to be emulated, with the exception of any VLSI components, which may be externally connected to the emulation array as shown with respect to FIG. 3.

Figure 3:
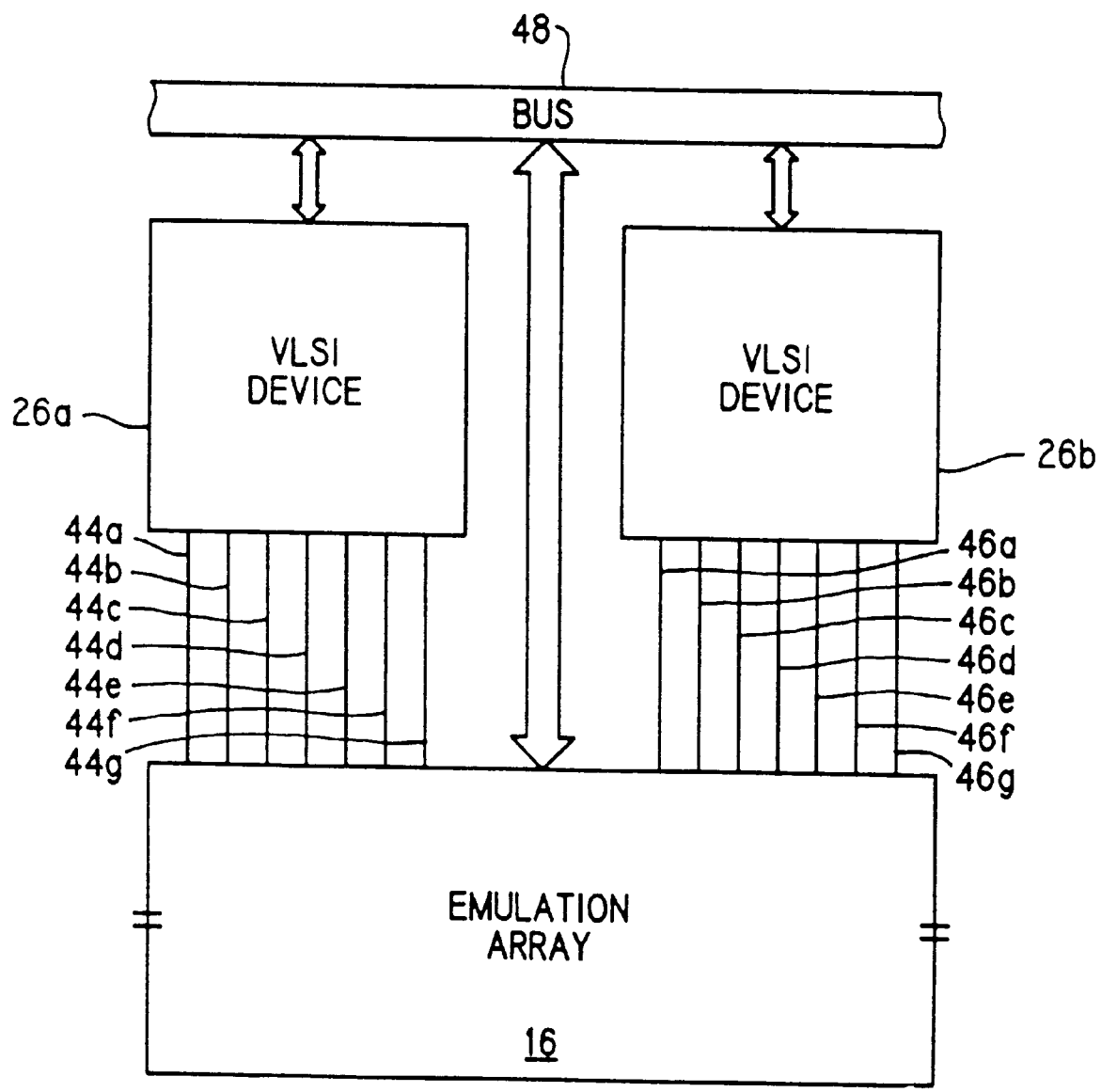
FIG. 3 is a block diagram of a portion of the emulation array showing physical device emulation and provision for connecting external VLSI devices to the apparatus.

Referring now to FIG. 3, VLSI devices 26a and 26b are shown connected to emulation array 16 via a plurality of conductors 44a–g and 46a–g. In addition, bus 48 is shown connected both to each VLSI device and to emulation array 16. Bus 48 is provided for bus architecture oriented VLSI devices such as microprocessors, having address and data busses, etc.

Those of ordinary skill in the art will readily recognize that the VLSI devices 26a and 26b are shown illustratively connected to emulation array 16 with only seven signal lines 44a–g and 46-a–g and bus 48, respectively. In practice, any number of single signal connections may be made to these devices, the exact number being a matter of design choice based upon the maximum likely number of such connections which would be needed as well as the total number of signal lines available for the devices.

Figure 4:
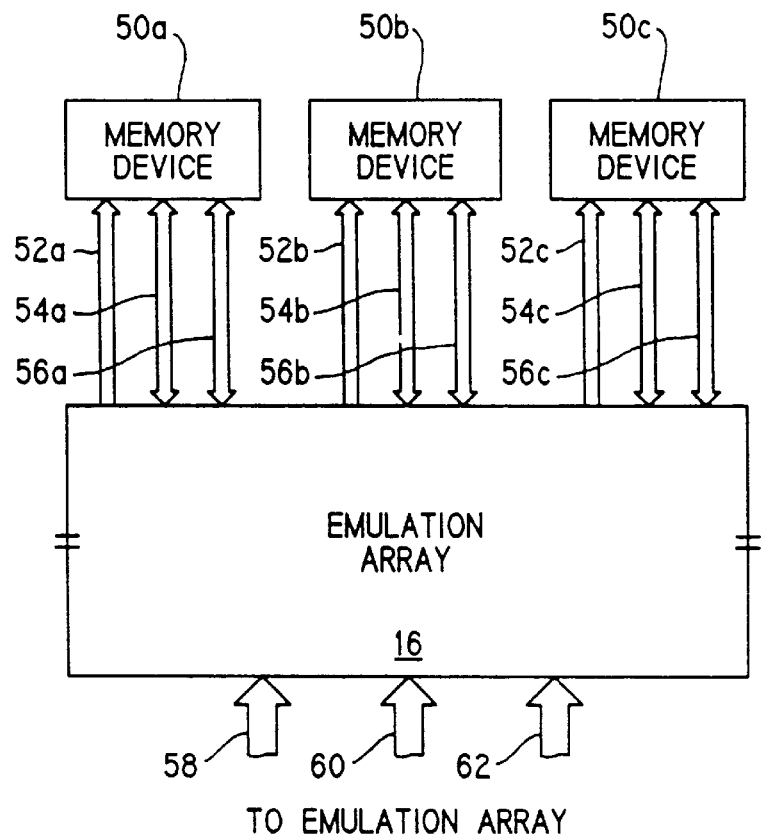
FIG. 4 is a block diagram of a portion of the emulation array showing elements used for memory device emulation.

Referring now to FIG. 4, a presently-preferred embodiment of a memory device emulation circuit is shown. Memory devices 50a, 50b, and 50c are shown having their address, data and control lines connected to a programmable gate array device 18 in emulation array 16. Thus, address busses 52a, 52b, and 52c of memory devices 50a, 50b, and 50c respectively are shown connected to programmable gate array device 18 as are data lines 54a–c and control lines 56a–c. Master address bus 58, master data bus 60 and master control bus 62 connect from programmable gate array 18 to the emulation array 16. By the appropriate programming of the interconnects in the programmable gate array matrix 16 the memory devices 50a, 50b, and 50c in the circuit of FIG. 4, may be configured to emulate memory arrays of varying widths and depths as required by the circuit being emulated.

As will be appreciated by those of ordinary skill in the art, the memory devices 50a, 50b, and 50c can be virtually any type of memory. The numbers of address data and control lines will vary with size and type of memory and those of ordinary skill in the art will have no difficulty realizing how to configure a memory emulation array as depicted in FIG. 4 using any type of memory chips.

Figure 5:
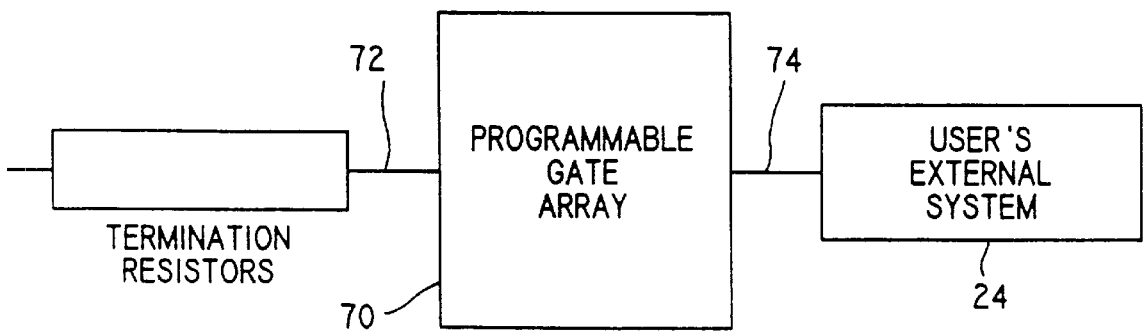
FIG. 5 is a block diagram of the interface portion of the present apparatus which connects the apparatus of the present invention to the user's system.

Referring now to FIG. 5, the interface between the emulation array 16 and the users external system 24 will be described. The interface unit (reference 25 of FIG. 1) may be configured from a programmable gate array 70. Programmable gate array 70 may also be a Xilinx XC3090 programmable gate array integrated circuit. The function of the programmable gate array 70 will be to provide signal mapping between the emulation array 16 and the user's external system 24. Programmable gate array 70 provides connections and signal paths between the plurality of conductors coming into the programmable gate array 70 on lines 72, and the lines 74 connecting programmable gate array 70 to the user's external system 24. Another function of the programmable gate array 70 to provide buffering of the signals on lines 72 and 74.

A third function of programmable gate array 70 is to provide local implementation of high speed logic. For certain circuit designs, there may be some critical signal paths which, if routed through the emulation array, would cause system failure because of the time delay associated with signal paths involved in the emulation array 16. For such circuits, the critical path logic may be implemented in the interface unit close to the user's external system to cut down the signal path time and the signal delay.

A presently-preferred embodiment, line 72 is a 75 ohm cable transmission line. Those of ordinary skill in the art will recognize that termination resistors, useful to prevent signal reflections at the ends of the cables should be provided at each end of the transmission lines since the line 72 is bi-directional and will be conducting signals in one direction or another direction depending on the particular design being emulated.

Figure 6:
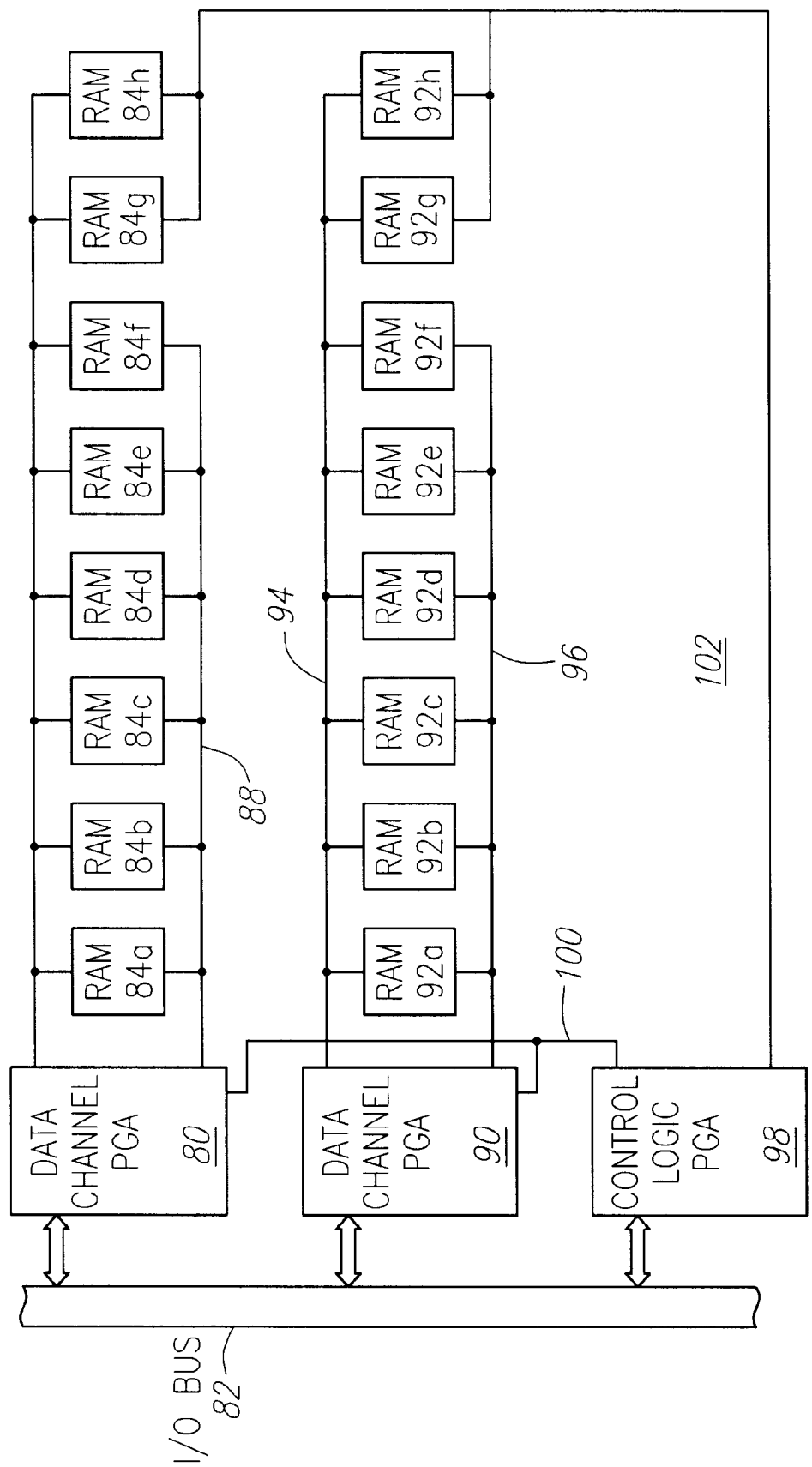
FIG. 6 is a block diagram of logic analyzer and pattern generator for use with the present invention.

Referring now to FIG. 6, the logic analyzer and pattern generator circuitry of the present invention is seen to include a plurality of programmable gate arrays. In a presently preferred embodiment, a first data channel programmable gate array 80 is connected between an I/O bus 82 and a plurality of random access memory (RAM) chips 84a–h. A common address bus 86 is connected to all of the RAM chips 84a–h from data channel programmable gate array 80. A data bus 88 is connected from the data channel programmable gate array 80 to the data inputs of the RAM chips 84a through 84f.

A second data channel programmable gate array 90 is connected to the I/O bus 82. A plurality of RAM chips 92a–h are connected to data channel programmable gate array 90 via an address bus 94. A data bus 96 connects the second data channel programmable gate array 90 to the data inputs of random access memory chips 92a–92f. Together, first and second data channel programmable gate arrays 80 and 90, and their associated RAM chips 84a–h and 92a–h, constitute a data module. The present invention may use one or more data modules. In a presently preferred embodiment, there are four data modules.

The data channel programmable gate array 80 and 90 are controlled by a control logic programmable gate array 98 which is connected to I/O bus 82. Control lines 100 connect control logic programmable gate array 98 to data channel programmable gate arrays 80 and 90. A time stamp bus 102 connects control logic programmable gate array 98 to the data inputs of random access memories 84g and h and 92g and h. The time stamp signal from control logic programmable gate array 98 places event time information into random access memories 84g and h and 92g and h simultaneous with data from events being written into random access memories 84a–f and 92a–f.

Figure 7:
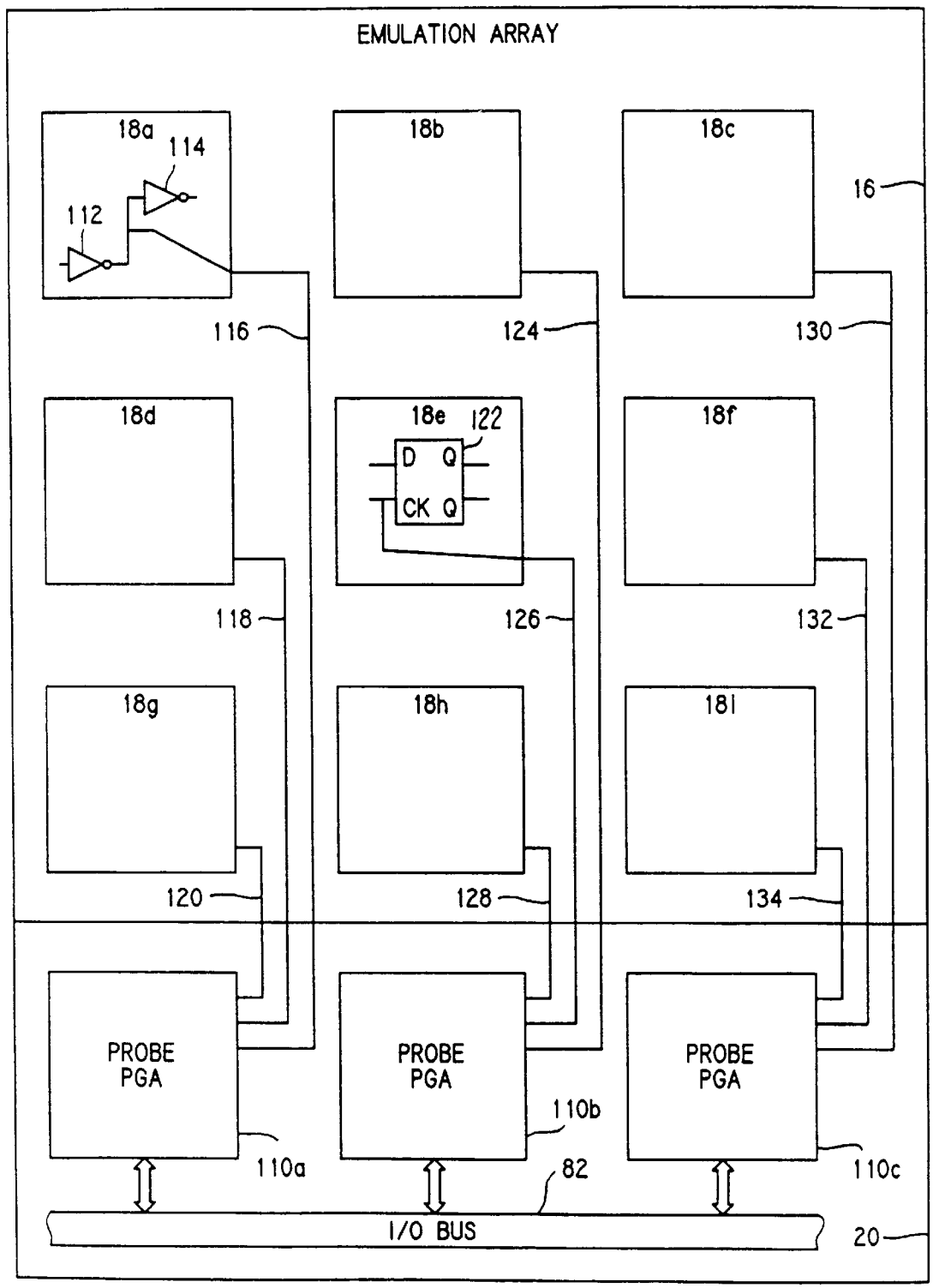
FIG. 7 is a block diagram of an example of the use of the probing logic of the present invention.

Referring now to FIG. 7, the probing logic of a preferred embodiment of the present invention is disclosed. The probing logic section 20 contains probe programmable gate arrays 110a, 110b and 110c. Probe programmable gate arrays 110a–c are connected to I/O bus 82.

Each of probe programmable gate arrays 110a, 110b, and 110c are connected to the programmable gate arrays in the emulation array in the column of the matrix above it. Thus, probe programmable gate array 110a has connections to emulation array programmable gate arrays 18a, 18d, and 18g; probe programmable gate array 110b has connections to emulation array programmable gate arrays 18b, 18e, and 18h, and probe programmable gate array 110c has connections to emulation array programmable gate arrays 18c, 18f, and 18i.

The operation of the probing logic will be shown using the example illustrated in FIG. 7. Those of ordinary skill in the art will readily recognize that FIG. 7 is merely an illustration and the probing logic shown in FIG. 7 is generally applicable.

In the illustration of FIG. 7, emulation array programmable gate array 18a is shown to include a pair of inverters 112 and 114. A line 116 is shown extending from emulation array programmable gate array 18a to probe programmable gate array 110a. Similarly, lines 118 and 120 connect emulation array programmable gate arrays 18d and 18g to probe programmable gate array 110a.

In the second column of the matrix of emulation array 16, a D flip-flop 122 is shown in emulation array programmable gate array 18e. Lines 124, 126, and 128 are shown connecting emulation array programmable gate arrays 18b, 18e, and 18h, respectively, to probe programmable gate array 110b.

In a similarly manner, lines 130 132, and 134 are shown connecting emulation array prograrmable gate arrays 18c, 18f, and 18i, respectively, to probe programmable gate array 110c. Those of ordinary skill in the art will readily recognize that lines 116, 118, 120, 124, 126, 128, 130, 132, and 134 are shown as single lines for illustrative purposes only. In any practical embodiment, a plurality of such lines may be provided so that multiple points in any of the emulation array programmable gate arrays can be probed by the probe programmable gate arrays. In a presently preferred embodiment, there are 9 lines connected from each probe programmable gate array to each emulation array programmable gate array in the column above it.

Returning to the illustrative embodiment of FIG. 7, suppose it is desired to probe the output of inventor 112. Emulation array programmable gate array 18a is programmed, creating a connection between the I/O pin to which line 116 is connected and the node comprising the output of inverter 112 and the input of inverter 114.

Similarly, if the clock input of D flip-flop 122 inside emulation array programmable gate array 18e is to be probed, that programmable gate array is programmed to create a connection between line 126 and the clock input of D flip-flop 122. A second connection is created within one of the probe PGAs (10a–c to route the probed signal to one of the I/O Bus Signals.

The programmable gate arrays used in the various portions of the present invention are programmed by configuration unit 14. The programming of the programmable gate arrays by configuration unit 14 may be best understood with reference to FIG. 8. This discloses one presently preferred method of configuring programmable gate arrays. Other methods are available and are explained in the Xilinx data book.

Figure 8:
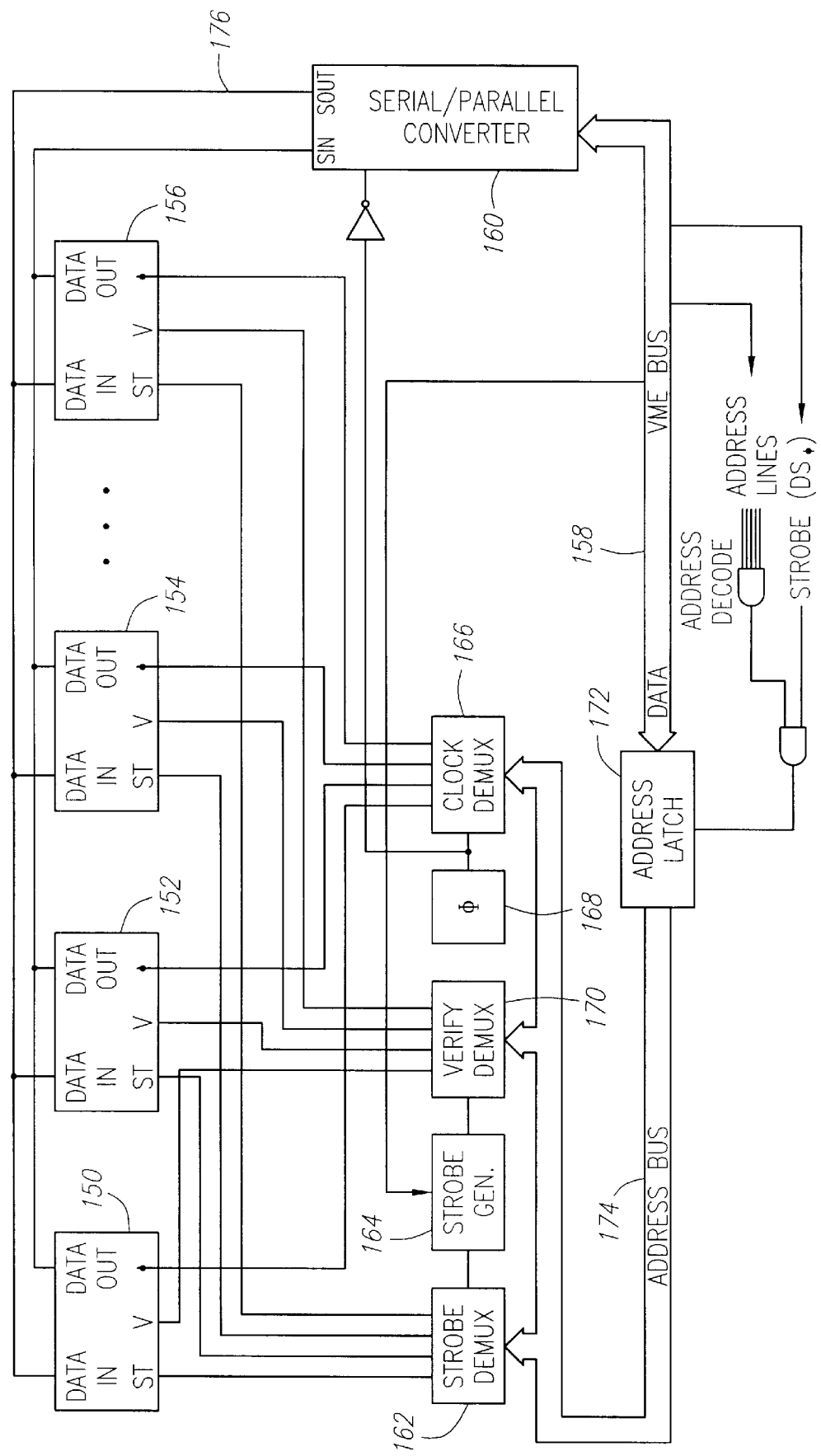

For purposes of the explanation of configuration unit 14, illustrative programmable gate arrays 150, 152, 154, and 156 are shown in FIG. 8, although it is to be understood by those of ordinary skill in the art that programmable gate arrays 150, 152, 154 and 156 represent all such gate arrays in the system and that by understanding the principles herein disclosed, a particular system configured according to the present invention could have an arbitrary number of programmable gate arrays.

Data entry work station 12 of FIG. 1a may be connected to the standard VME bus well understood by those of ordinary skill in the art. VME bus 158 in FIG. 8 is the bus connected to the output of data entry work station 12. The VME bus 158 is connected to serial to parallel converter 160, and to address latch 172 and to Strobe generator 164. The output of address latch 172 is address bus 174, which is connected to strobe demultiplexer 162, clock demultiplexer 166, and verify demultiplexer 170.

The serial output and serial input of serial/parallel converter 160 are connected to the data inputs and the data outputs, respectively, of programmable gate arrays 150, 152, 154, and 156. Strobe demultiplexer 162, connected on one end to address bus 174, has an output for each of the programmable gate arrays 150, 152, 154, and 156. Verify demultiplexer 170 is likewise connected on one end to address bus 174 and has an output for each of programmable gate arrays 150, 152, 154, and 156. Both strobe demultiplexer 162 and verify demultiplexer 170 are connected to strobe generator 164. The function of strobe generator 164 is to provide an edge-activated strobe signal which either strobe demultiplexer 162 or verify demultiplexer 170 will route to the appropriate one of the programmable gate arrays 150, 152, 154, or 156. Strobe generator 164 is connected to the DS0 data strobe line in the VME bus 158.

Clock demultiplexer 166 is connected on one end to address bus 174 and has an output corresponding to each of programmable gate arrays 150, 152, 154, and 156. Clock demultiplexer 166 is also connected to clock generator 168 which is used to clock the data into programmable gate arrays 150, 152, 154, and 156.

The configuration software which runs in data entry work station 12 results in a series of files each of which programs one of the programmable gate array chips in the system. Information from these files is transferred to the configuration unit 14 as a plurality of bytes. A software routine running in the data entry work station directs the programming of all programmable gate arrays in the system using the hardware of configuration unit 14. Three signals are needed to program the programmable gate arrays. The first, a clock signal, is decoded from a master clock signal by clock demultiplexer 166. The second signal is a strobe signal, which is an edge triggered strobe and is decoded by strobe demultiplexer 162. The strobe signal acts as an enable signal to the selected one of illustrative programmable gate arrays 150, 152, 154 or 156. The third signal used to program the programmable gate arrays is the data itself, which is sent as a serial data stream. Clock demultiplexer 166 is necessary because upon system power up, the nature of the presently-preferred programmable gate array devices is such that they all are enabled to receive data, thus requiring some selection process to prevent the nonselected programmable gate array chips from programming.

The data entry work station first sends an address across the VME bus which specifies address latch 172. A data byte is latched into address latch 172 and appears on address bus 174. Once the address information in address latch 172 is valid, data entry workstation 12 sends a strobe signal over VME bus 158 to strobe generator 164 which then provides the necessary strobe signal to strobe demultiplexer 162. Strobe demultiplexer 162 routes the strobe signal to the selected one of the programmable gate arrays 150, 152, 154, or 156. Data from VME bus 158 is then loaded into serial/parallel converter 160. The data is then clocked out onto serial out line 176 which is commonly connected to the data input lines of programmable gate arrays 150, 152, 154, and 156. The clocking serial/parallel converter 160 is coordinated with the clocking from clock 168, providing the clock signal to clock demultiplexer 166. The clock signals from clock generator 168, routed via clock demultiplexer 166 to the selected one of programmable gate arrays 150, 152, 154, and 156 allow the serial data appearing on Sout line 176 of serial/parallel converter 160 to be taken into the appropriate programmable gate array one bit at a time. After serial/parallel converter 160 has been emptied, the VME bus supplies another data byte to serial/parallel converter 160. The clocking of the data into the selected programmable gate array is then repeated. Each successive data byte is delayed by withholding the VME DTACK signal until the preceding byte has been shifted out of the serial/parallel converter. Another byte is loaded into serial/parallel converter 160 and clocked into the selected programmable gate array until all of the data bytes for the selected programmable gate array have been loaded into the array. VME bus 158 then loads another address into address latch 172, thus selecting another programmable gate array for programming. This process is repeated until all of the programmable gate arrays in the system have been loaded with information.

After all the programmable gate arrays in the system have been loaded, the information which has been loaded into them may be verified for correctness. Verify demultiplexer 170 selects a programmable gate array for verification and provides a strobe signal started by VME bus 158, generated by strobe generator 164 and routed by verify demultiplexer 170. Clock 168, routed to the appropriate programmable gate array via clock demultiplexer 166 clocks serial data out of the data output of the selected programmable gate array and into the Sin input of serial/parallel converter 160. Once serial/parallel converter 160 has been loaded, its parallel data is placed out onto the VME bus.

This process is completely analogous to the loading process except for the data direction.

Although the data in and data out connections of programmable gate arrays 150, 152, 154, and 156 are shown connected to a single serial/parallel converter 176, those of ordinary skill in the art will realize that both the data in and data out connections of the programmable gate arrays may be split and buffered as is known in the art to reduce loading and noise.

Figure 9:
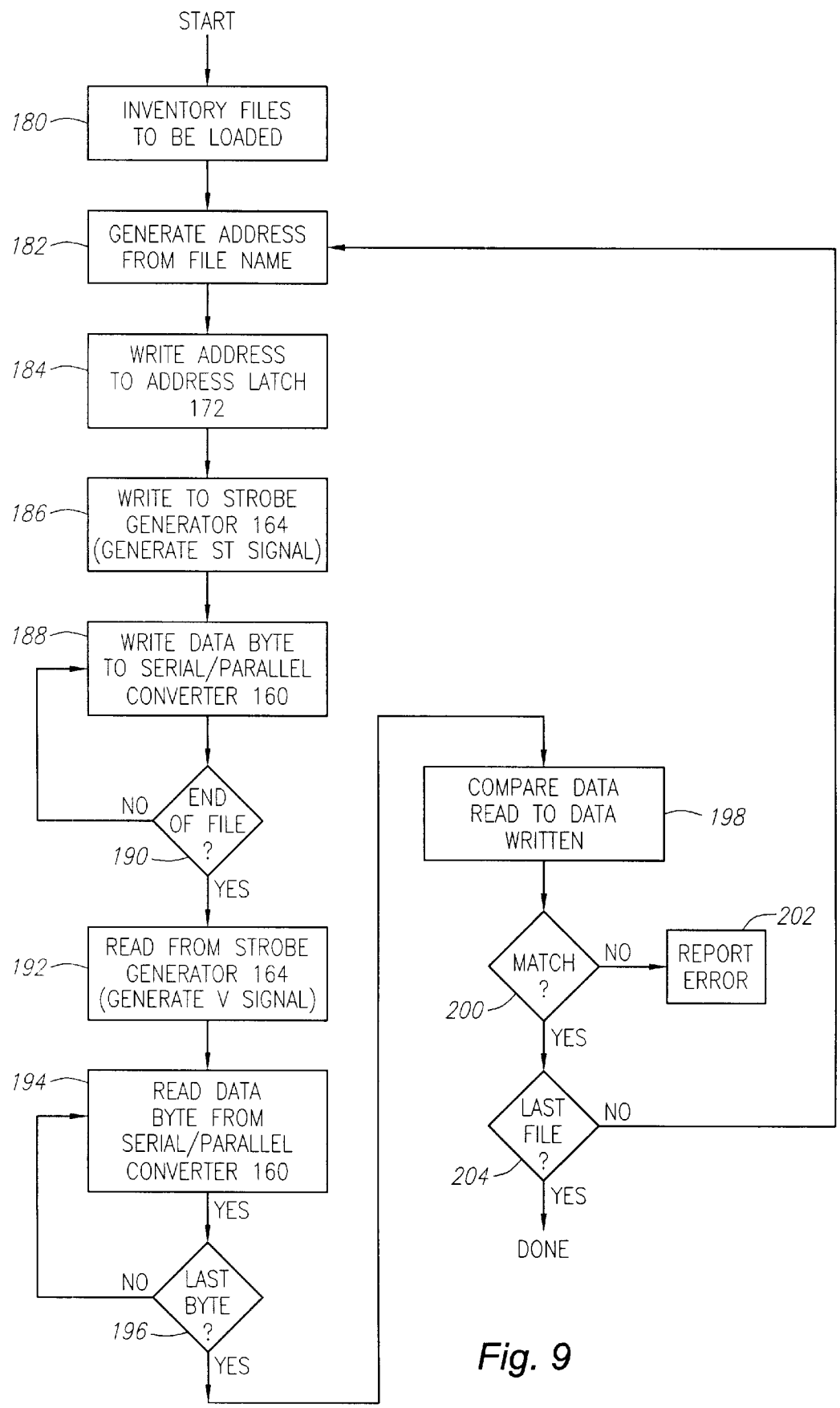
FIG. 9 is a flow diagram of a presently preferred routine for loading information into the programmable gate arrays.

Referring now to FIG. 9, a preferred routine for the loading of information into the gate arrays of the present invention is disclosed. First, at step 180, the files to be loaded are inventoried. Next, at step 182, the first file name is used to generate an address. Next, at step 184, that address is written into address latch 172. Next, at step 186 a strobe signal is generated by writing to strobe generator 164. At step 188, a data byte is written into serial/parallel to converter 160.

Next, at step 190, the decision is made whether the data byte just written is the last data byte in the file. If is not, step 188 is repeated. If the data byte just written was the last data byte in the file, a verify signal is generated by the strobe generator at step 192. Next, at step 194, the data byte is read from the serial/parallel converter 160. Next, at step 196, it is determined whether the byte just read is the last byte in the file. If not, step 194 is repeated. If it was the last byte, the data read is compared to the data written at step 198.

At step 200 it is determined whether the written data matches the read data, and if the data does not match an error is reported at step 202. If the data does match, at step 204 it is determined whether the file just operated on is the last file. If not, the program returns to step 182 to process the next file. If so, the program terminates.

Data Entry workstation 12 runs several software programs which convert the information input by the system user into information which may be used directly by configuration unit 14 to program all the programmable gate arrays used in the present invention. An additional software program is used to control the hardware in configuration unit 14 for the purposes of both programming and verifying the information in the programmable gate arrays. A block diagram of a presently-preferred software structure useful in the present invention is shown in FIG. 10.

Figure 10:
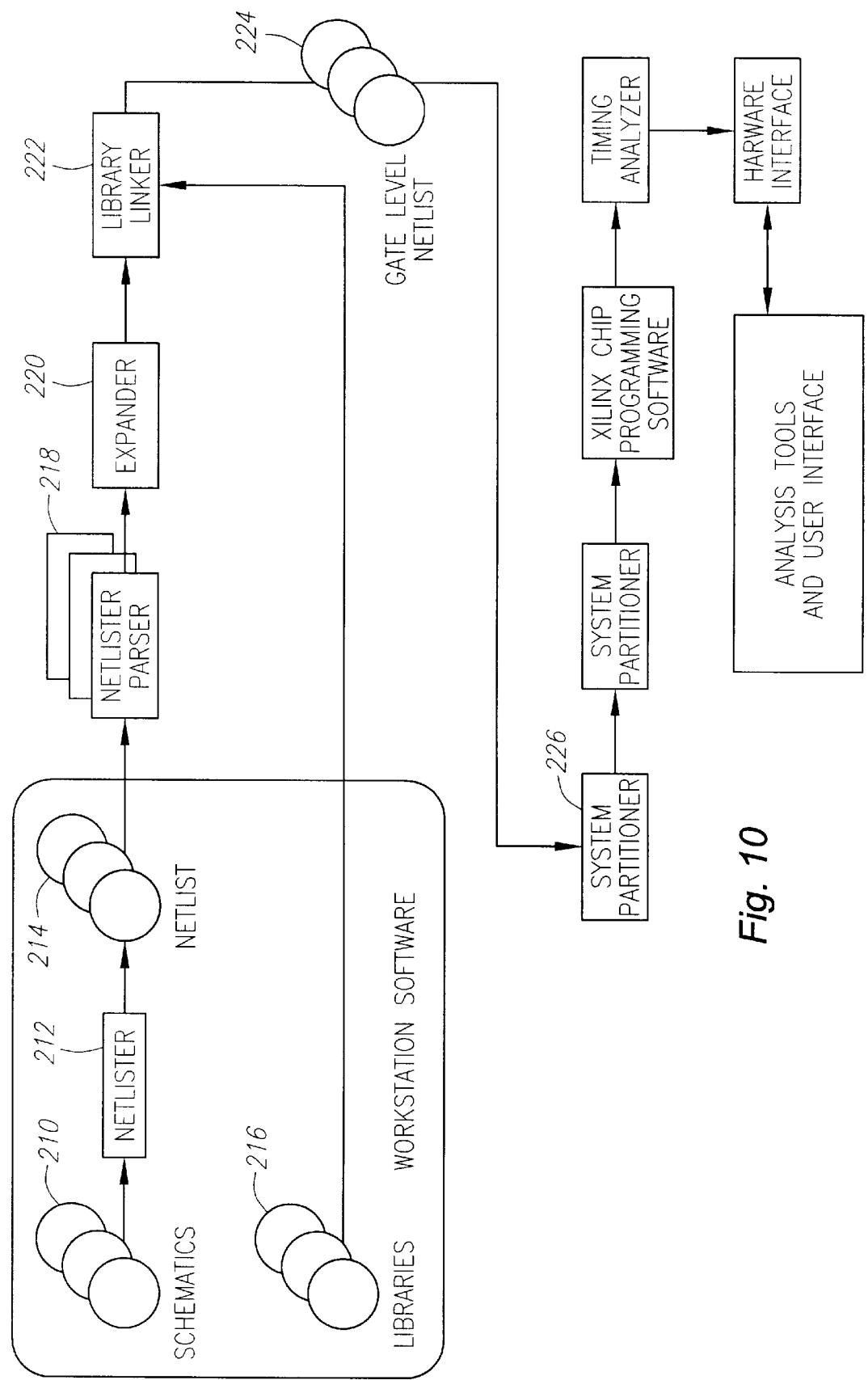
FIG. 10 is a diagram of the software routines which may be utilized in a presently-preferred embodiment.

Referring now to FIG. 10, a schematics data file 210 is created in data entry workstation 12 by the user. Netlister 212 converts schematics data file 210 into netlist file 214. Library file 216 contains information about the individual logic components which will be configured into the user's real circuit or system and which the system of the present invention will emulate. Library file 216 may be made up of any number of individual component model library files readily available from information provided by semiconductor and component manufacturers. The choice of which of such library files to incorporate into a system constructed in accordance with the present invention is purely a matter of the marketeer's choice, and is in no way within the scope of the present invention.

Netlister 212, and library 216 are readily available in commercially available data entry workstations; however, the library is sometimes provided in a proprietary format, which must. either be converted or substituted by a conventional format library. Schematic file 210 is of course, created by the user.

Netlist file 214 is read by netlist parser 218, which places data from netlist file 214 into memory.

Information from netlist parser 218 is processed by hierarchical netlist expander 220 and the resulting data is linked with the data from library file 216 in library linker 222. Parsers, linkers and netlist expanders are well-understood by those of ordinary skill in the art, and are straightforwardly implemented.

The netlist information, linked with the library information by library linker 222, is now a gate level net list 224 in a form suitable for functional implementation and timing analysis as is well understood by those of ordinary skill in the art.

The next step, shown at reference numeral 226, is to partition the circuit to be emulated among the gate arrays in the emulation system. In a presently preferred embodiment, this may be accomplished by software such as that disclosed herein with respect to FIGS. 11a–e.

After partitioning, the next step in the process of configuring is system routing, shown at reference numeral 228, which assigns the connection between circuit elements to available chip to chip wiring resources. This may be accomplished by using a Lee-Moore maze router as described in Lee, C. An Algorithm for Path Connections and its Applications, IRE Trans. on Electronic Computers, Vec-10 pp. 346–365, Sept. 1961, which is expressly incorporated by reference herein.

Once the gate level netlist has been partitioned on to the programmable gate arrays, the information may be processed by software which produces information for programming the gate arrays. This step is shown at reference numeral 230. Such software is available from Xilinx, Inc., of San Jose, Calif., and is known as XNF2LCA, APR, and XACT. This processing produces a set of bit stream files which may be directly loaded into the programmable gate arrays. The loading of the files into the programmable gate arrays is disclosed elsewhere herein.

At step 232, timing analysis is performed. In a presently-preferred embodiment, software known as "Motive", available from Quad Design Technology of Camarillo, Calif., may be used.

In a presently preferred embodiment, FIGS. 11a–e illustrate how partitioning may be accomplished.

Figure 11A:
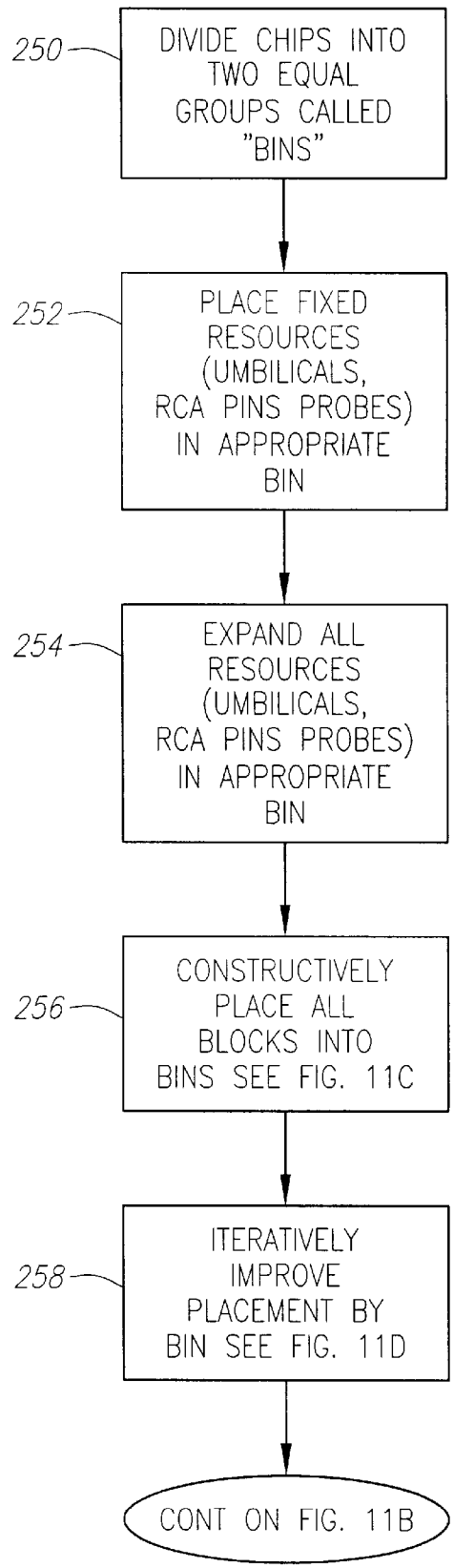
FIGS. 11a–e are flow diagrams of software routines for accomplishing system partitioning of circuit elements according to a presently-preferred embodiment of the present invention.

Referring first to FIG. 11a, at step 250, the total number of gate array chips are divided into two equal groups called "bins". Next, at step 252 the fixed resources, which consist of I/O connections, probes to the circuit, VSLI connections, memory, etc., shown in FIG. 1, for example, at reference numerals 24, 20 26 and 28, are placed in appropriate bins which are physically located close to the circuit elements to which they will connect.

Next, at step 254 all blocks in the hierarchical net list with a size greater than 66% of the bin capacity are expanded. This step breaks up large blocks into smaller pieces.

Next, at step 256, all blocks are constructively placed into bins. This process is described in more detail with reference to FIG. 11c.

Next, at step 258, the bin placement is iteratively improved. This process is more clearly described with reference to FIG. 11d.

Figure 11B:
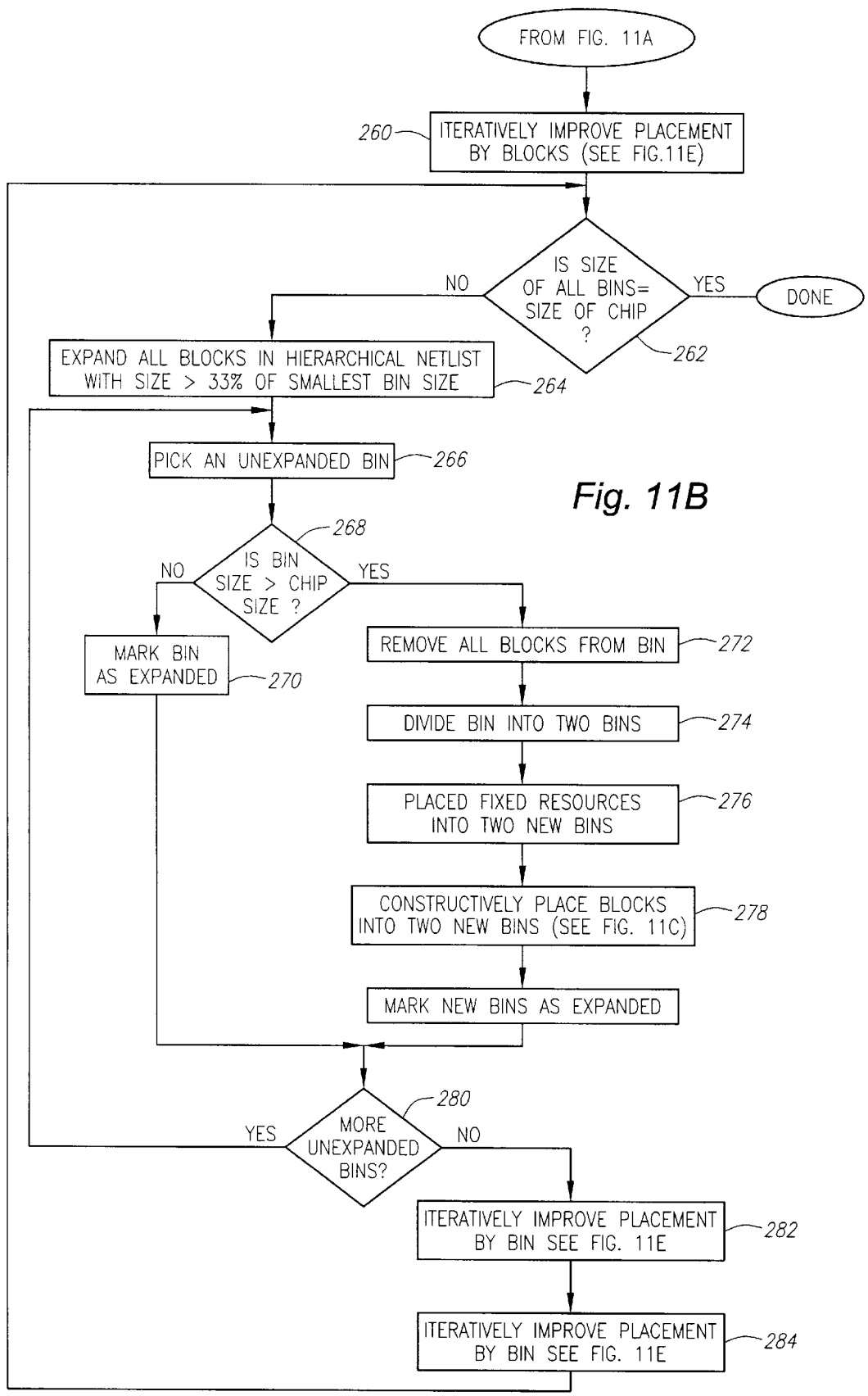

Referring now to FIG. 11b, the placement by block is iteratively improved at step 260. This procedure is described in detail with reference to FIG. 11e. At step 262, the determination is made whether or not the size of all bins is equal to the size of a chip. If so, the placement is finished and the program terminates. If not, all blocks in the hierarchical net list with a size greater than 33% of the smallest bin presently defined are expanded. First, at step 266, a bin, which this sub-routine has not yet operated on, is selected. Next, at step 268, a determination is made whether the bin size is greater than the chip size. If the bin size is not greater than the chip size, this bin is marked as expanded at step 270. If the bin size is greater than the chip size, the bin is expanded.

First, at step 272, all blocks are removed from the bin. Next, at 274 the bin is divided into two bins. The division of bins is accomplished such that bins are multiples of chip sizes. For instance, if a bin is the size of three chips, this step may break the bin into one bin having the size of two chips and one bin having size of one chip.

Next at step 276, the fixed resources which were in the old bin are placed into the two newly-created bins. At 278, the blocks are constructively placed into the new bins. This procedure is described in detail with reference to FIG. 11c. Next, at step 280 these new bins are marked as having been expanded. Next, at step 280 a determination is made whether there are any more unexpanded bins left. If so, the program returns to step 266 and repeats. If not, the placement by bin is iteratively improved at step 282. This routine is described in detail with reference to FIG. 11d. Next, at step 284, the placement by block is iteratively improved as shown with respect to FIG. 11e. After step 284, the program returns to step 262 to determine whether the size of all bins is equal to or greater than the size of the single chip.

Figure 11C:
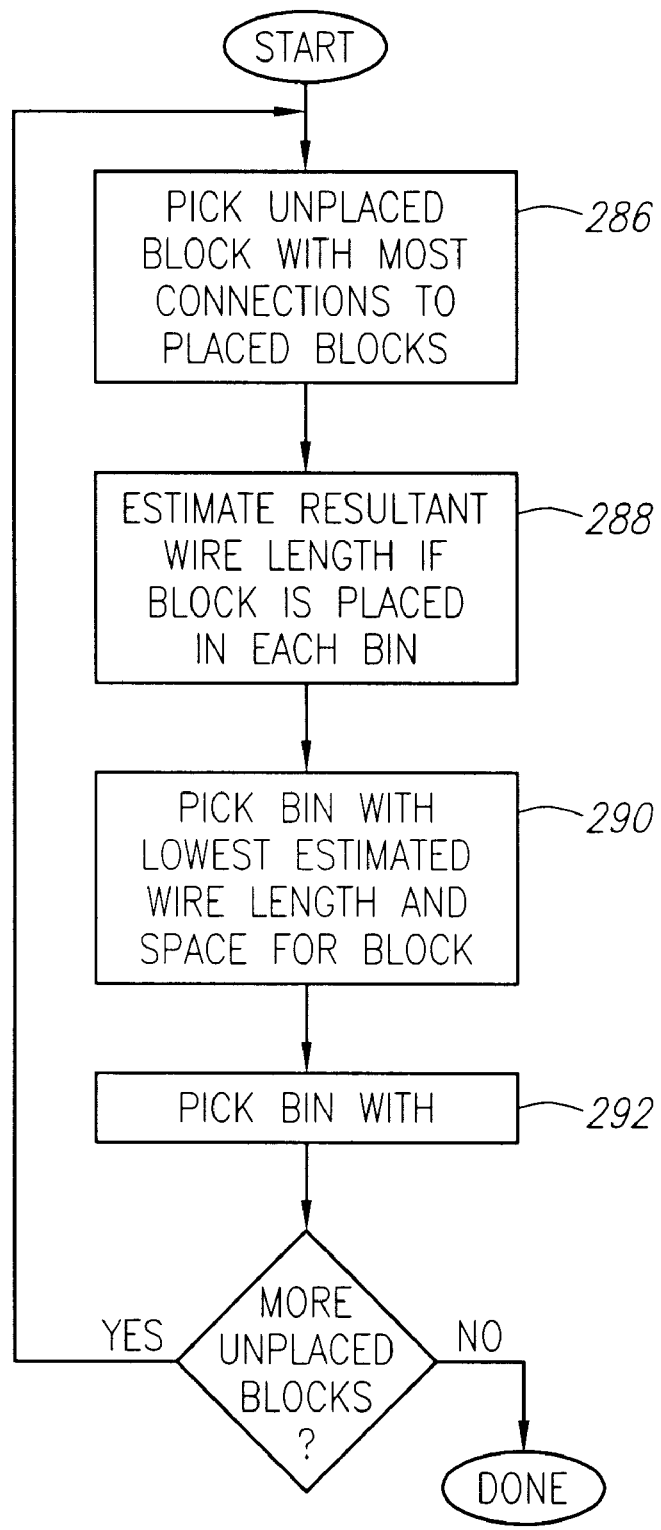

Referring now to FIG. 11c, a subroutine which constructively places blocks into bins is disclosed. First, at step 286 the unplaced block with the most connections to already-placed blocks is selected. Next, at step 288 the resultant wire length if the block is placed in each bin is estimated. Next, at step 290, the bin having the lowest estimated wire length and space for the block is picked. Next, at step 292, the block is placed in this selected bin. Next, at step 294, it is determined whether there remain any more unplaced blocks. If not, the subroutine terminates. If so, the routine repeats 286 with respect to one of these unplaced blocks.

Figure 11D:
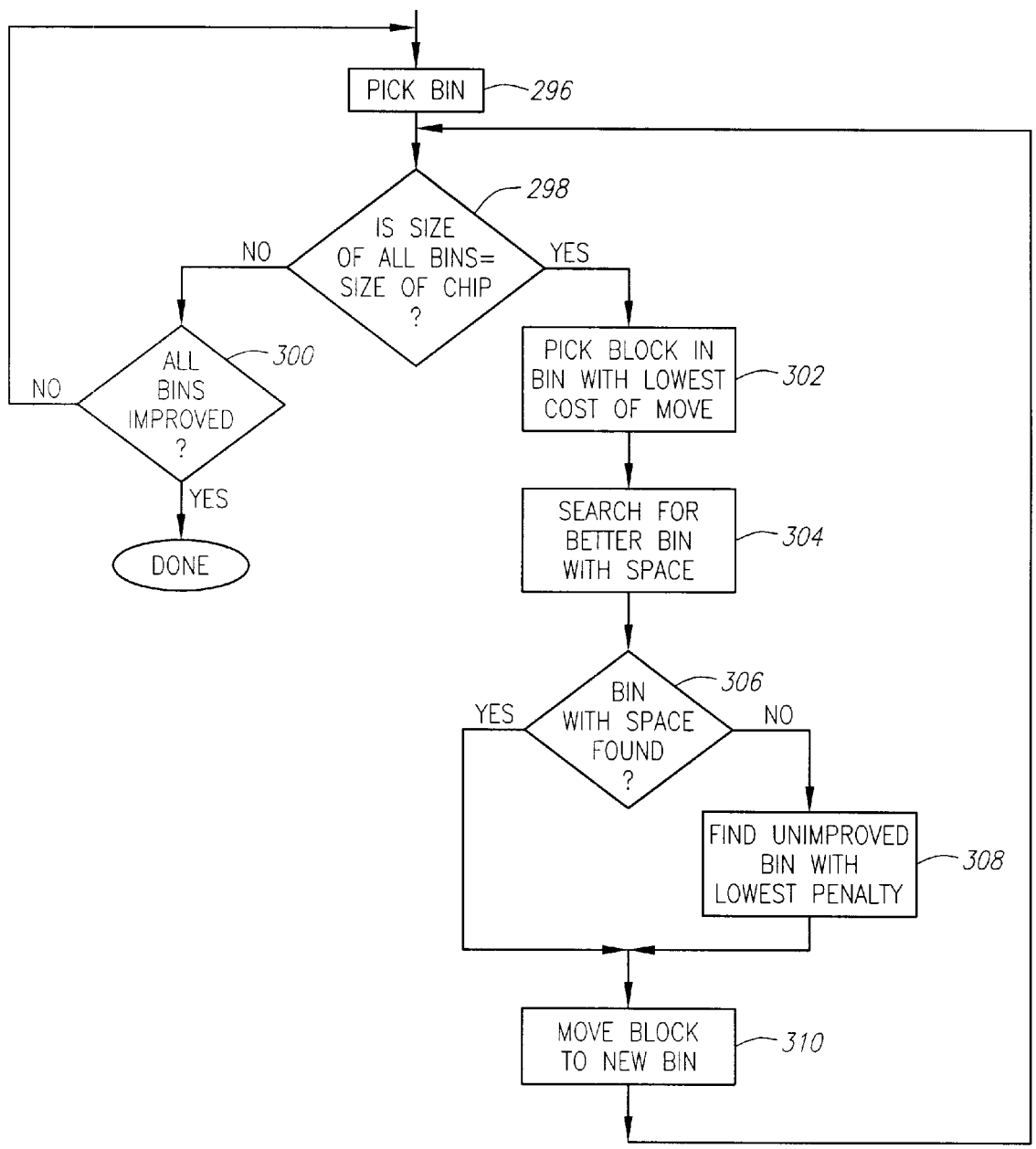

Referring now to FIG. 11d, the subroutine for iteratively improving the bin placement is disclosed. First, at step 296, a bin is selected, next, at step 298, it is determined whether the bin size or outset size is greater than a threshold. The Outset size is equal to the number of connections which traverse bin boundaries, The threshold is based on the available wires which traverse the bin boundaries. In a presently-preferred embodiments the threshold is 80%.

Therefore, if greater than 80% of the wires traversing the bin boundaries are used up, the answer is affirmative. If the bin size or cutset size does not exceed the threshold, the decision is made at step 300 whether all bins have been improved. If yes, the subroutine is terminated, if not the subroutine returns to step 296.

If the bin size or cutset size is greater than the threshold, a block within that bin having the lowest cost to move is picked at step 302. Choosing which block to move is related to the cutset reduction and the size of the block. For example, a relatively small block having a large reduction in cutset size if moved is an ideal candidate to move. On the other hand a large block having a small cutset reduction if moved is less than ideal to move.

Next, at step 304, a better available bin with space is sought. The criteria for selecting this best bin include whether the block fits into the bin, whether adding the block would make the cutset exceed threshold, and whether the bin into which the block is placed, will result in the lowest overall estimated wire length. Next, at step 306, it is determined whether such a bin with space has been found. If a better bin with space has been found, the block is moved to a new bin at 310. If no better bin with any space has been found the unimproved bin having the lowest penalty is selected at step 308 and at step 310 the block is moved to this new bin. The subroutine than returns to step 298.

Figure 11E:
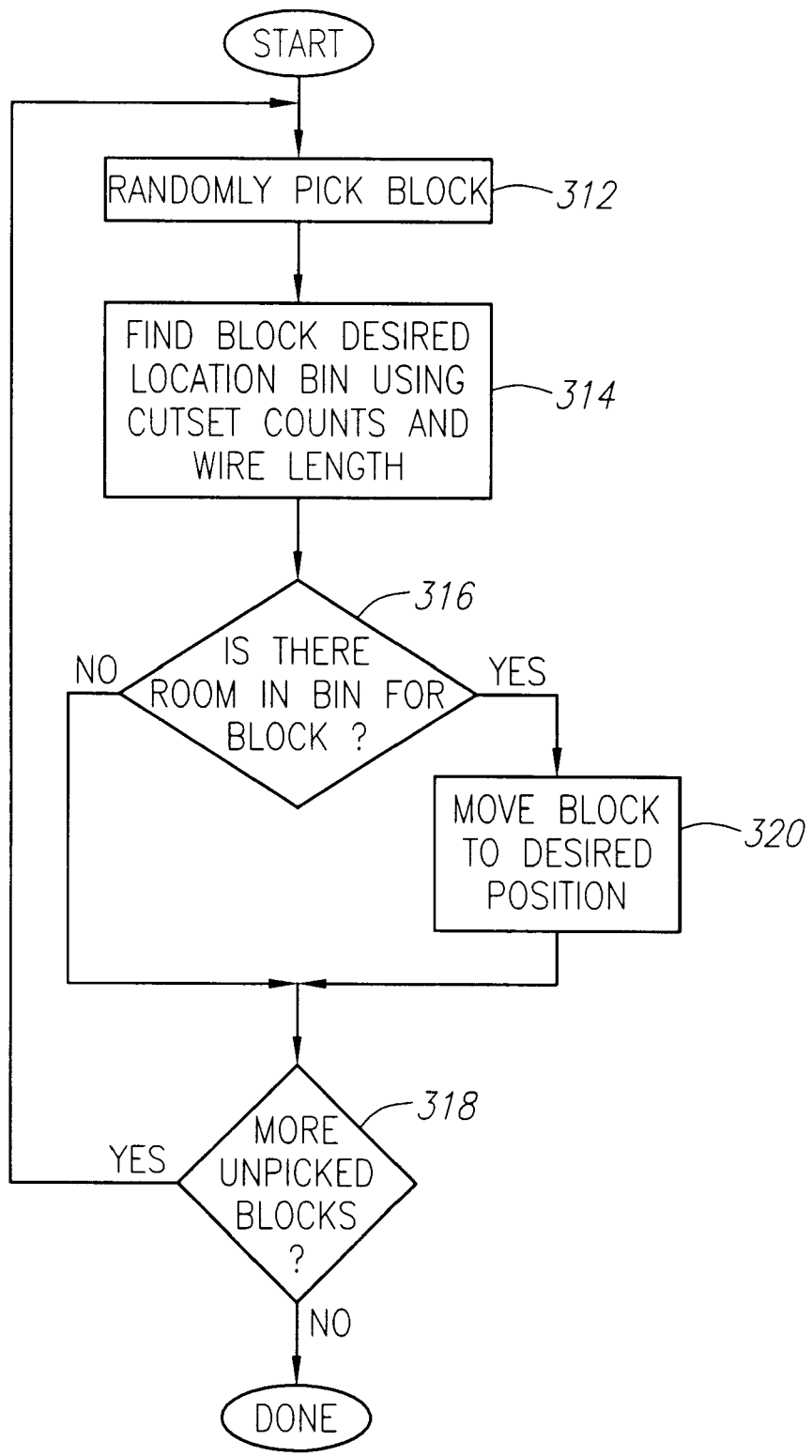

Referring now to FIG. 11e, the iterative improvement by block subroutine is disclosed. First, at step 312, a block is randomly picked. Next, at step 314, the desired location for that block in a bin is chosen. It is desired to move the block, if at all, towards the direction in which the block has the most connections. The facts which are used to make this determination are the desire to minimize the cutset count and to minimize the estimated wire length. If both of these factors have already been minimized, there is no need to move the block.

At step 316, the determination is made whether there is enough room in the desired bin to place the block. If not, the block is not moved and it is determined at step 318 whether there are any more unpicked blocks. If not, the routine ends. If so, it returns to step 312 to randomly pick another block. If, at step 316 it has been determined that there is room in the bin for the block, the block is moved to the desired bin at step 320. The routine then continues to step 318 at previously described.

While a presently-preferred embodiment of the invention has been disclosed, those of ordinary skill in the art will be enabled to contemplate variations from the information given in this disclosure. Such variations are intended to fall within the scope of the present invention which shall be limited only by the apended claims.

What is claimed is:

1. An hardware logic emulation system comprising:

a printed circuit board having an emulation array disposed thereon, said emulation array comprising:

a plurality of first programmable integrated circuits, said first programmable integrated circuits having programmable functional logic elements and input/output terminals capable of being connected to at least some of said functional logic elements;

at least one second programmable integrated circuit, said second programmable integrated circuit containing reprogrammable electrical conductors capable of reconfigurably interconnecting selected input/output terminals of selected ones of said plurality of first programmable integrated circuits such that selected functional logic elements in one of said selected ones of said plurality of first programmable integrated circuits containing functional logic elements can be electrically coupled to selected functional logic elements in another of said plurality of said first programmable integrated circuits; and an interface structure including circuitry which provides electrical paths for signals carrying signal information between an external system and said emulation array.

2. The hardware logic emulation system of claim 1 wherein said first programmable integrated circuit and said second programmable integrated circuit comprise programmable gate array devices.

3. The hardware logic emulation system of claim 2 wherein said first programmable integrated circuit and said second programmable integrated circuit comprise identical types of programmable gate array devices.

4. The hardware logic emulation system of claim 1 wherein said interface structure is a part of said emulation array.

* * * * *